United States Patent
Yassour

(10) Patent No.: US 7,857,121 B2
(45) Date of Patent: Dec. 28, 2010

(54) SYSTEM AND METHOD FOR ENHANCING CONVEYING PERFORMANCE OF CONVEYORS

(75) Inventor: Yuval Yassour, Kibbutz Hasolelim (IL)

(73) Assignee: Coreflow Scientific Solutions Ltd., Yokneam (IL)

( * ) Notice: Subject to any disclaimer, the term of this patent is extended or adjusted under 35 U.S.C. 154(b) by 83 days.

(21) Appl. No.: 12/067,131

(22) PCT Filed: Sep. 14, 2006

(86) PCT No.: PCT/IL2006/001085

§ 371 (c)(1), (2), (4) Date: Aug. 11, 2008

(87) PCT Pub. No.: WO2007/032011

PCT Pub. Date: Mar. 22, 2007

(65) Prior Publication Data

US 2008/0302637 A1 Dec. 11, 2008

Related U.S. Application Data

(60) Provisional application No. 60/716,956, filed on Sep. 15, 2005.

(51) Int. Cl.
*B65G 17/46* (2006.01)
(52) U.S. Cl. .................. 198/689.1; 198/688.1
(58) Field of Classification Search .............. 198/688.1, 198/689.1; 414/763, 751.1; 271/90, 98, 271/112, 132
See application file for complete search history.

(56) References Cited

U.S. PATENT DOCUMENTS

| | | | | |
|---|---|---|---|---|
| 3,680,677 A * | 8/1972 | Branch et al. | ............ | 198/689.1 |
| 4,804,081 A * | 2/1989 | Lenhardt | ................. | 198/689.1 |
| 5,964,568 A | 10/1999 | Codatto | | |
| 6,152,444 A | 11/2000 | Elgee et al. | | |
| 6,367,609 B2 * | 4/2002 | Caspi et al. | ............. | 198/346.2 |

(Continued)

FOREIGN PATENT DOCUMENTS

WO WO-01/14782 3/2001

(Continued)

OTHER PUBLICATIONS

International Search Report From Application No. PCT/IL06/01085 Date of mailing: Aug. 28, 2008.

*Primary Examiner*—James R Bidwell
(74) *Attorney, Agent, or Firm*—Pearl Cohen Zedek Latzer, LLP

(57) ABSTRACT

A system and method for conveying and for accurately handling a generally flat object employing a plurality of support elements. The system comprises: a plurality of vacuum preload drive wheels arranged in one or more drive units, each drive unit comprising at least one vacuum preload drive wheel; one or more vacuum ports located on one or more counter plates adjacent each of the vacuum preload drive wheels, for applying induced holding down forces on the object. The vacuum ports of each drive unit are fluidically connected to a main vacuum pipe with controllable valve to a vacuum source. When the main vacuum pipe is connected to a vacuum source the normal force between the object and the vacuum preload drive wheels is increased and accordingly the lateral drive force is increased.

37 Claims, 21 Drawing Sheets

U.S. PATENT DOCUMENTS

| | | |
|---|---|---|
| 6,523,572 B1 | 2/2003 | Levin |
| 6,644,703 B1 | 11/2003 | Levin |
| 7,314,344 B2 | 1/2008 | Chen et al. |
| 2006/0000690 A1* | 1/2006 | Kim ........................ 198/688.1 |

FOREIGN PATENT DOCUMENTS

| | | |
|---|---|---|
| WO | WO-03/060961 | 7/2003 |

* cited by examiner

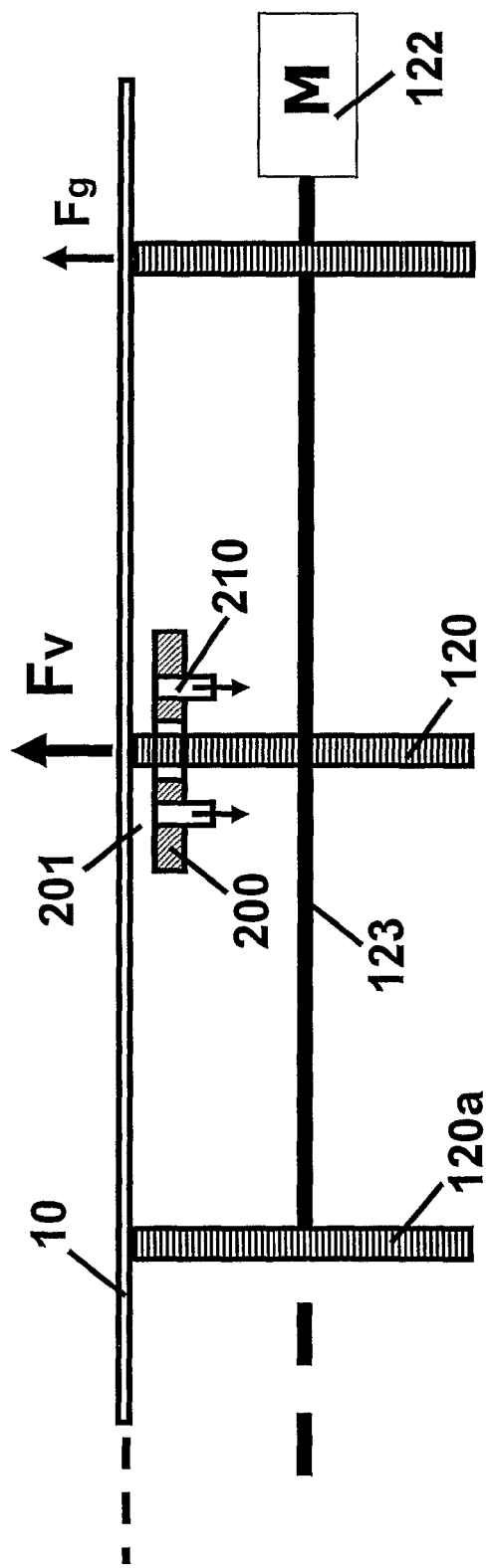
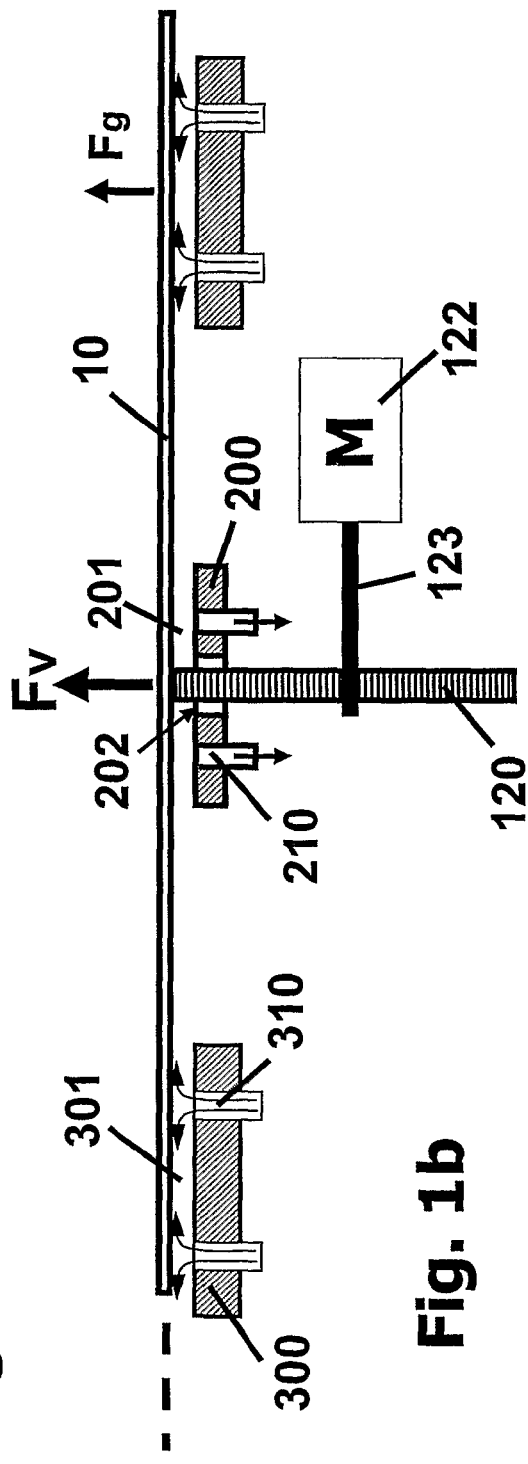
Fig. 1a
Fig. 1b

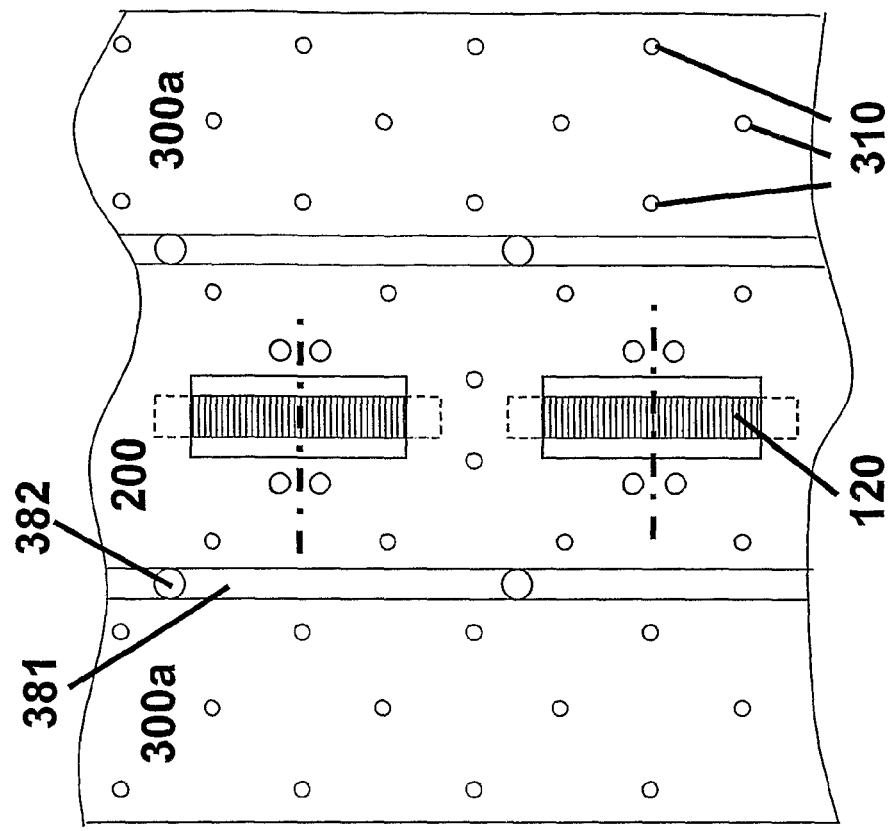
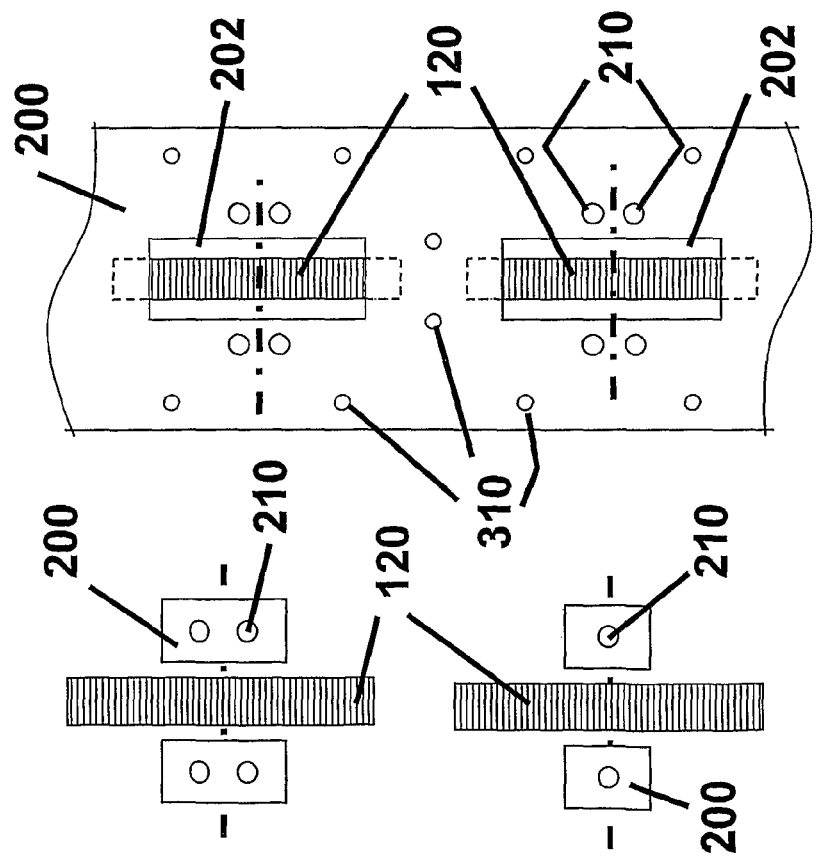

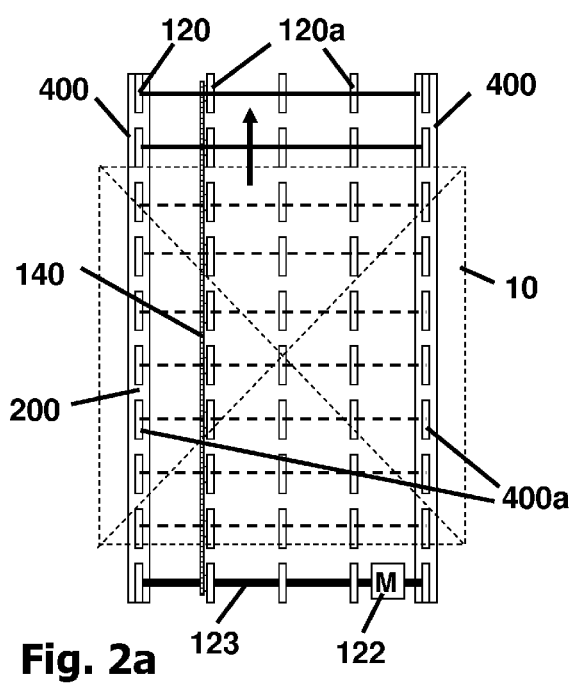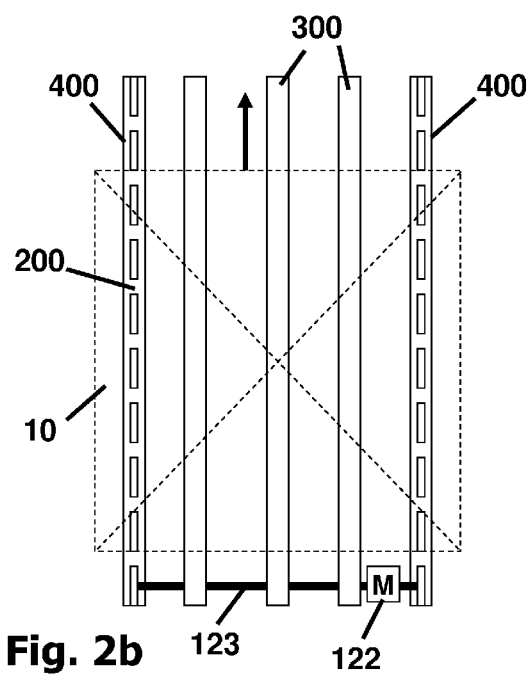

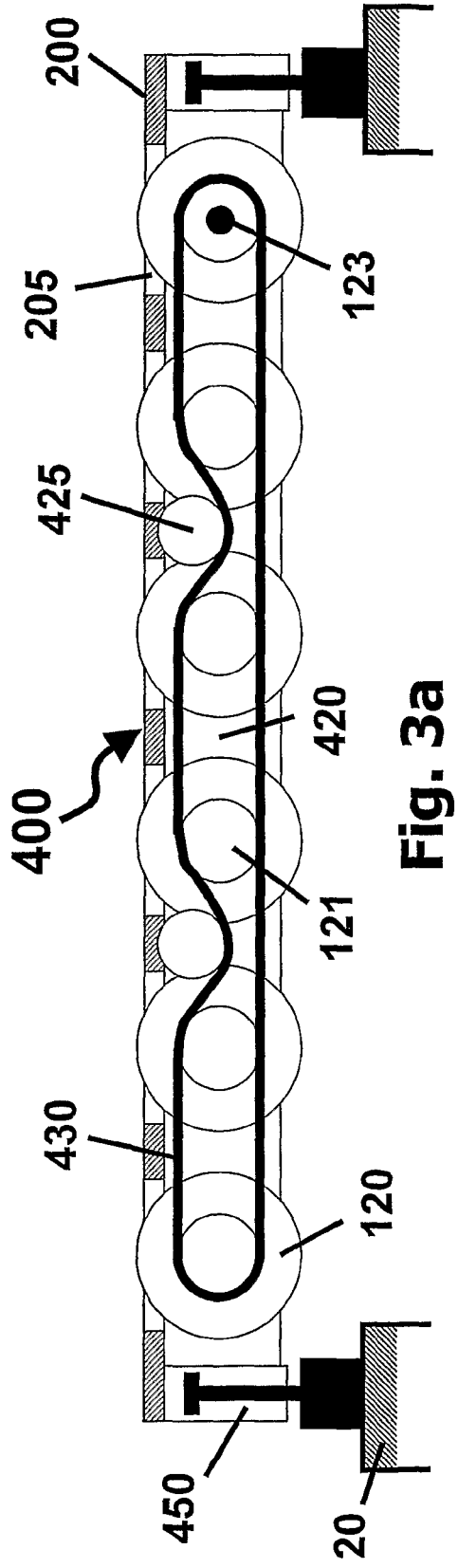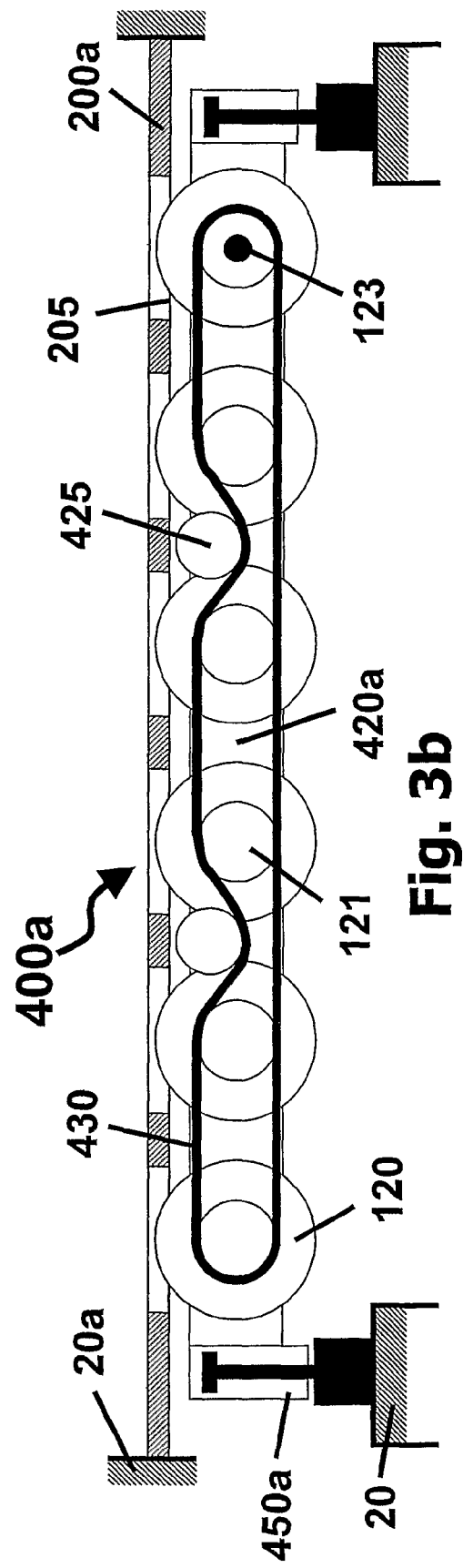

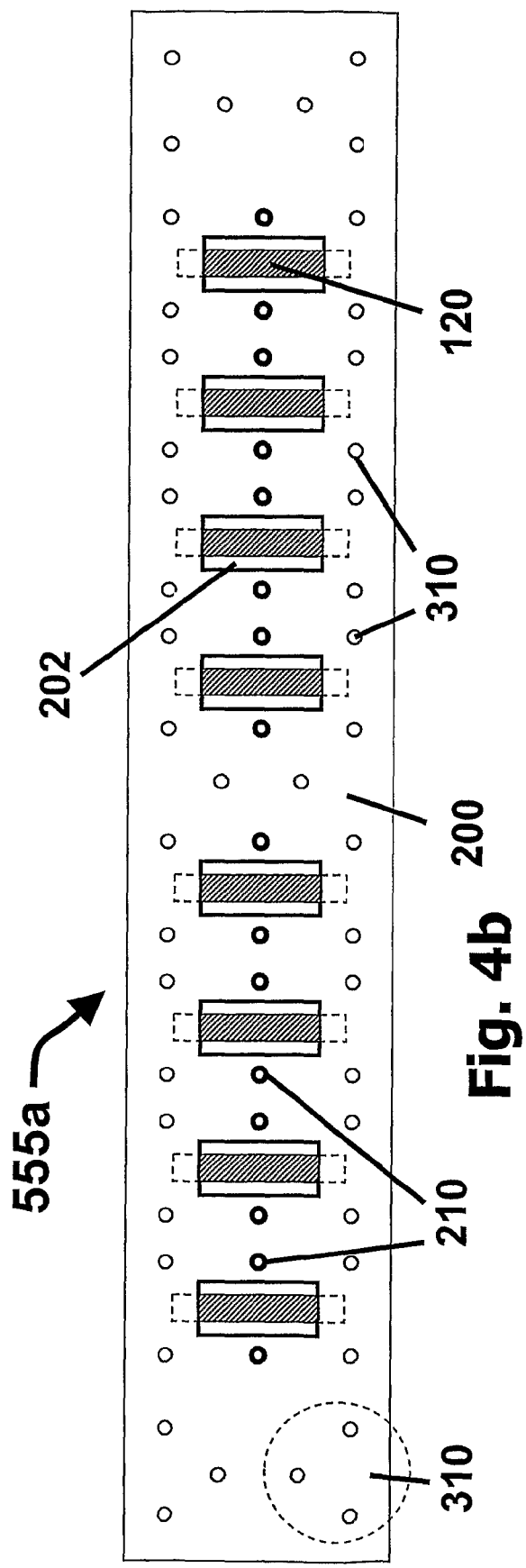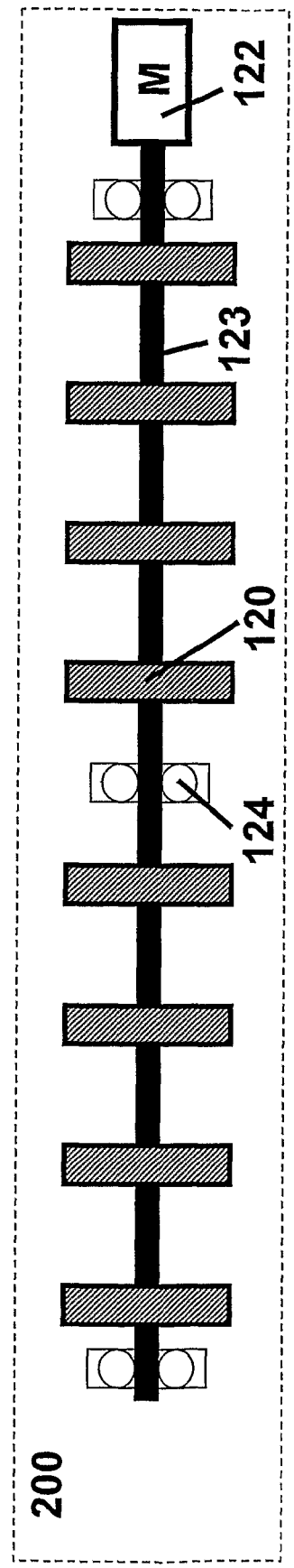
Fig. 4b
Fig. 4c

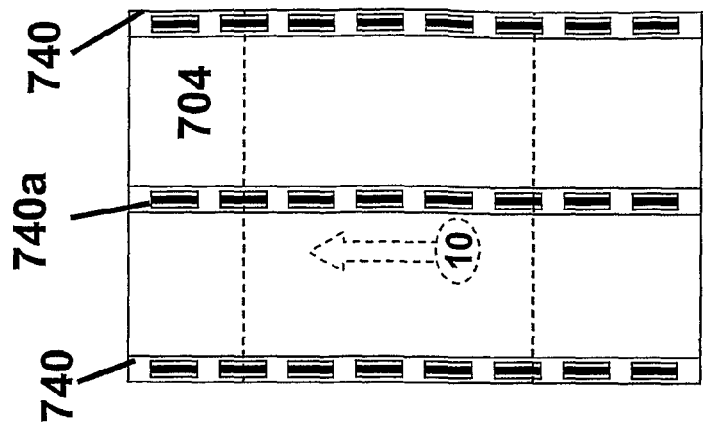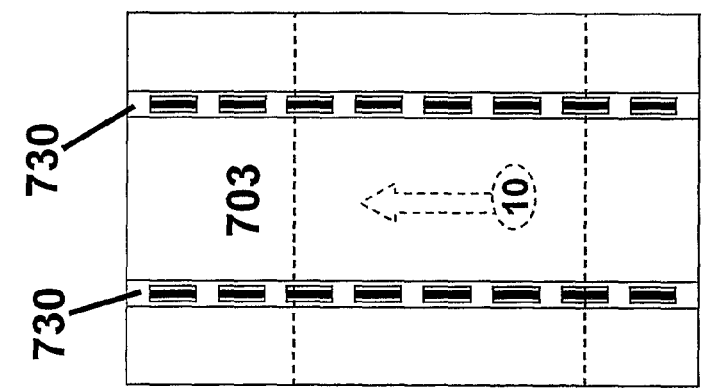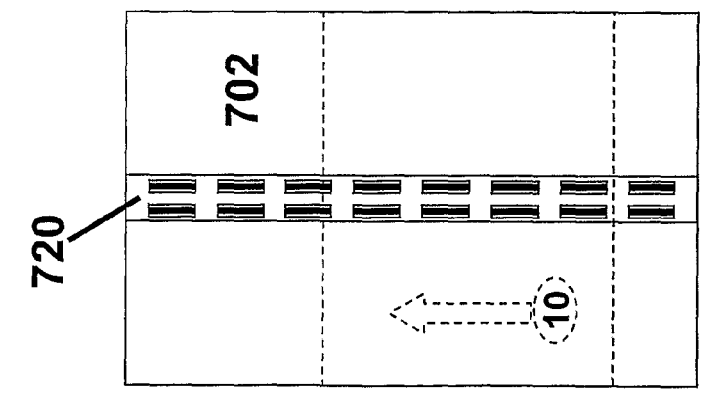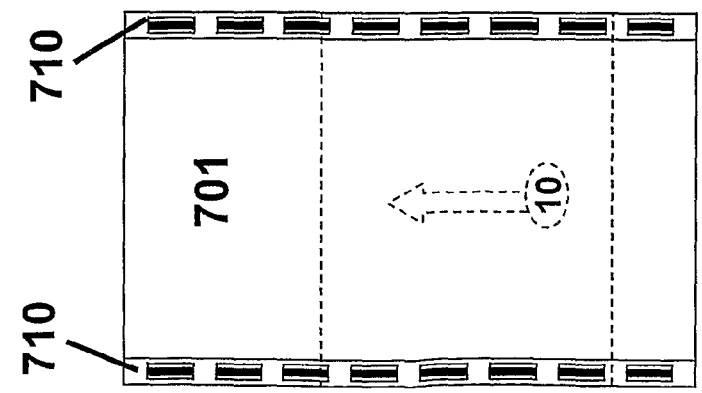

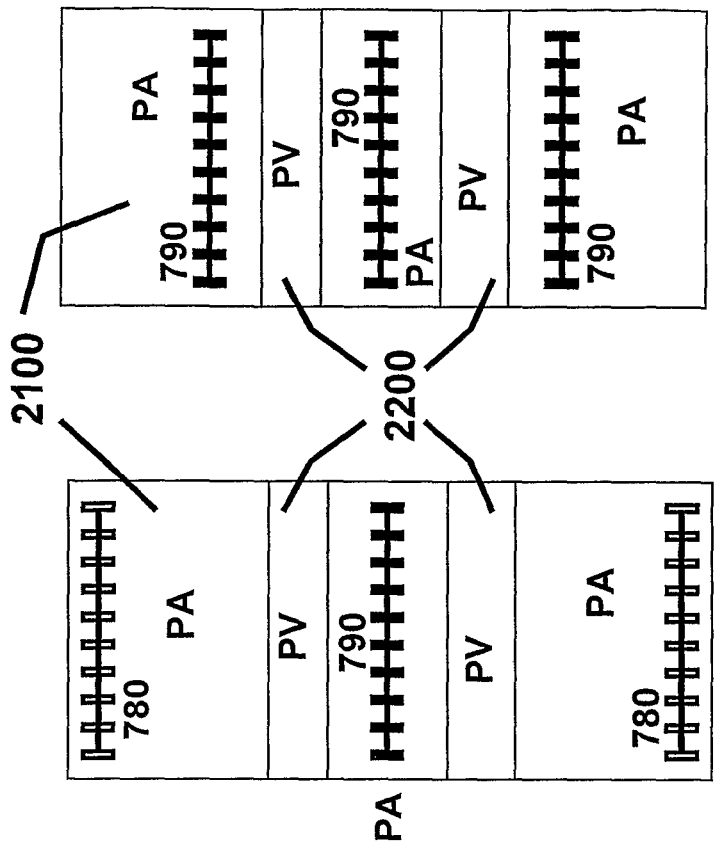
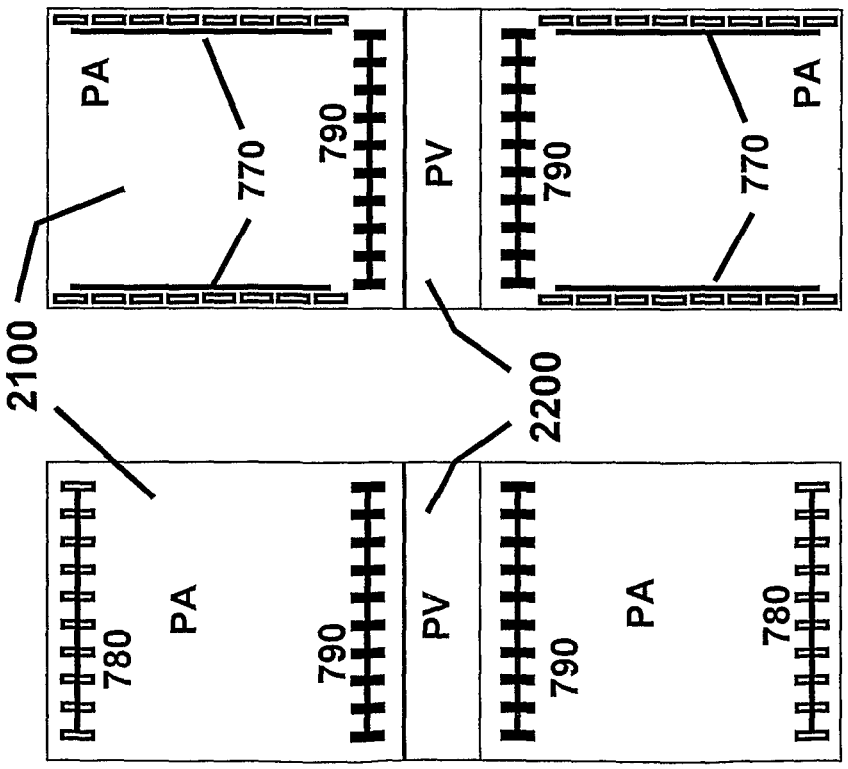

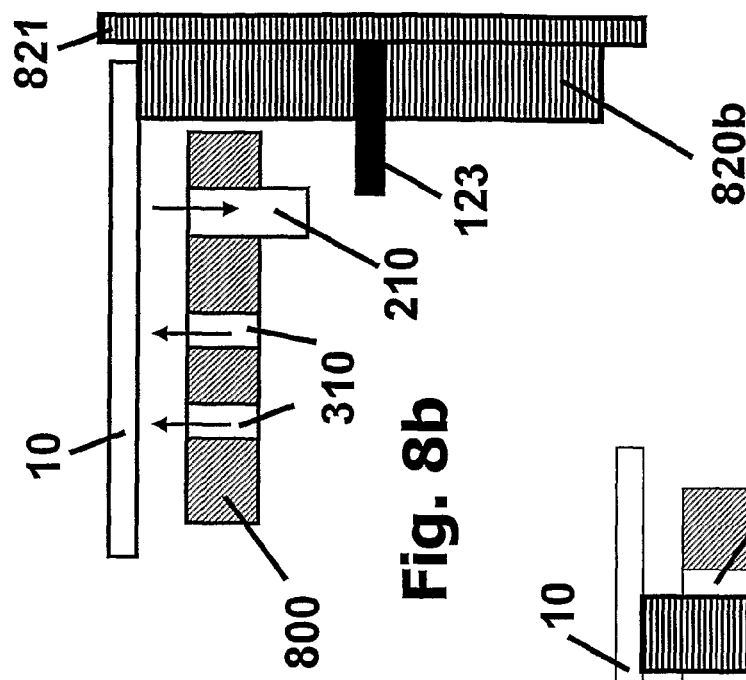
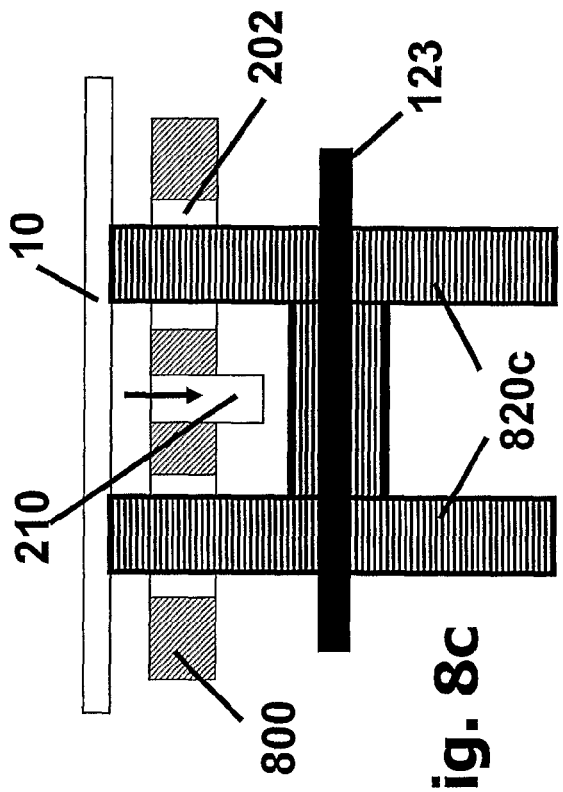
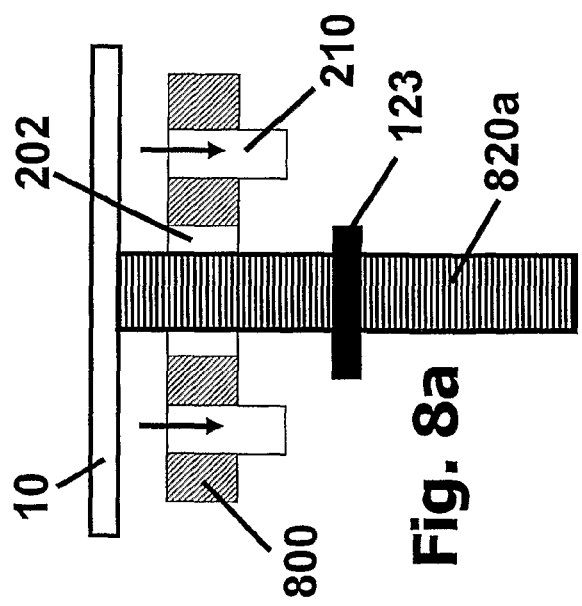
Fig. 8a
Fig. 8b
Fig. 8c

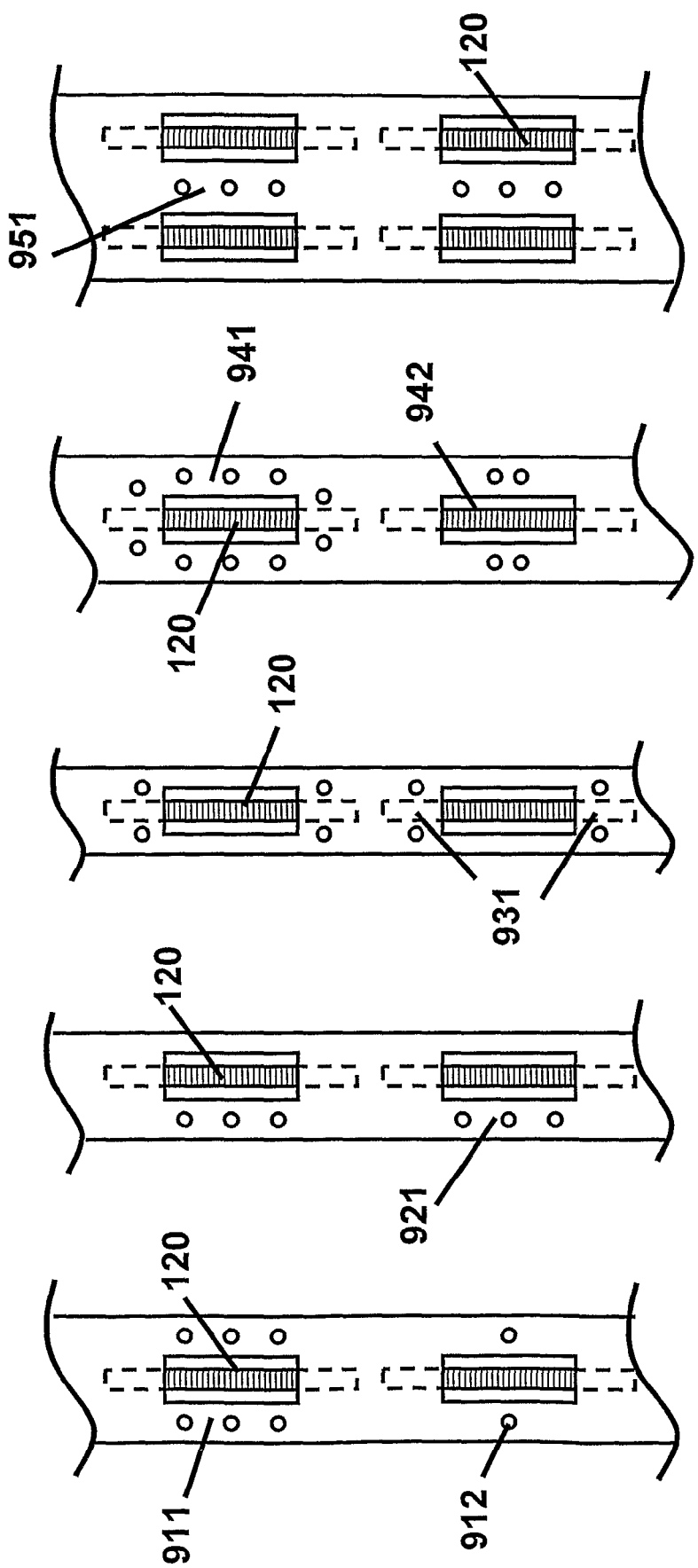

SYSTEM AND METHOD FOR ENHANCING CONVEYING PERFORMANCE OF CONVEYORS

CROSS-REFERENCE TO RELATED APPLICATIONS

This application is a National Phase Application of PCT International Application No. PCT/IL2006/001085, International Filing Date Sep. 14, 2006, published on Mar. 22, 2007 as International Publication No. WO 2007/032011, which in turn claims priority from U.S. Provisional Patent Application No. 60/716,956, filed Sep. 15, 2005, both of which are incorporated herein by reference in their entirety.

FIELD OF THE INVENTION

The present invention relates to conveying systems. More particularly it relates to a system and method for enhancing the performance of conveyers associated with non-contact conveying modules and a mechanism for applying accurate linear motion on substrates supported a non-contact aeromechanical (AM) platform during a process.

BACKGROUND OF THE INVENTION

Conveyers are used in many areas. The present invention is directed at enhancing the performance of conveyers of generally large flat objects, such as flat panel displays (FPD), Solar-Cell substrates, printing plates, as well as other flat substrates such as silicone wafers and other similar objects. Commonly such flat objects are conveyed over a plurality of wheels protruding from a conveyer surface, the wheels revolving beneath the object and advancing it in a desired direction. However, in case of light objects, or when the objects are primarily supported over an air-cushion (or an AM-platform), the wheels may slip under the object they support due to overall low friction, thus loosing grip of the object and failing to advance the object or directing it in wrong directions.

It is an object of the present invention to provide a conveyer apparatus with enhanced conveying performance.

It is another object of the present invention to provide a robust linear drive mechanism, mainly, but not only, for handling of substantially large yet thin objects (such a flat panel display—FPD—glass), over an accurate AM-platforms.

BRIEF DESCRIPTION OF THE DRAWINGS

FIG. 1a is a cross-sectional view of a vacuum preload (VPL) conveyer system according to a preferred embodiment of the present invention, employing drive-wheels for supporting and conveying a substrate, where vacuum preload is implemented on selective wheels.

FIG. 1b is a cross-sectional view of a VPL-conveyer system according to a preferred embodiment of the present invention, employing air-cushion for support and vacuum preloaded drive-wheels for generating the required driving force.

FIG. 1c is a close view of a VPL-conveyor having separate counter plates.

FIG. 1d is a close view of a stand-alone VPL-conveyor unit having a common counter plate equipped with both vacuum ports and pressure ports.

FIG. 1e is a close view of a VPL-conveyor similar to the VPL-conveyor shown in FIG. 2d but the counter plate is an integral section of an AM-platform.

FIG. 2a is an elevated view of a VPL-conveyer system according to a preferred embodiment of the present invention, employing rows of drive-wheels for supporting and conveying of a substrate where the side rows wheels are vacuums preloaded (see FIG. 1a).

FIG. 2b is an elevated view of a VPL-conveyer system according to a preferred embodiment of the present invention, having two side rows of vacuum preloaded drive wheels incorporating air-cushion support elements for supporting the substrate.

FIG. 3a illustrates a side view of a VPL-conveyer (wheel after wheel configuration), having a driving-belt mechanism according to a preferred embodiment of the present invention with a lifting mechanism for lifting both the drive-mechanism and the counter plate.

FIG. 3b illustrates a side view of a VPL-conveyer (wheel after wheel configuration) according to a preferred embodiment of the present invention, having a driving-belt mechanism with a lifting mechanism for lifting only the drive-mechanism.

FIGS. 4b-c illustrate top views of a "stand alone" VPL-conveyer (side by side drive-wheels configuration), according to a preferred embodiment of the present invention.

FIGS. 7a-7d illustrate various configurations of VPL-conveyer, according to some preferred embodiments of the present invention, integrated with non-contact conveying equipment.

FIGS. 7e-7h illustrate various configurations for a VPL-conveyer integrated with non-contact accurate platforms according to some preferred embodiments of the present invention.

FIGS. 8a-8c illustrate sectional views of several optional arrangements of vacuum ports in the vicinity of a conveyer wheel.

FIGS. 9a-9e illustrate elevated views of several optional arrangements of vacuum ports in the vicinity of a conveyer wheel.

DETAILED DESCRIPTION OF PREFERRED EMBODIMENTS

Figure 2C:
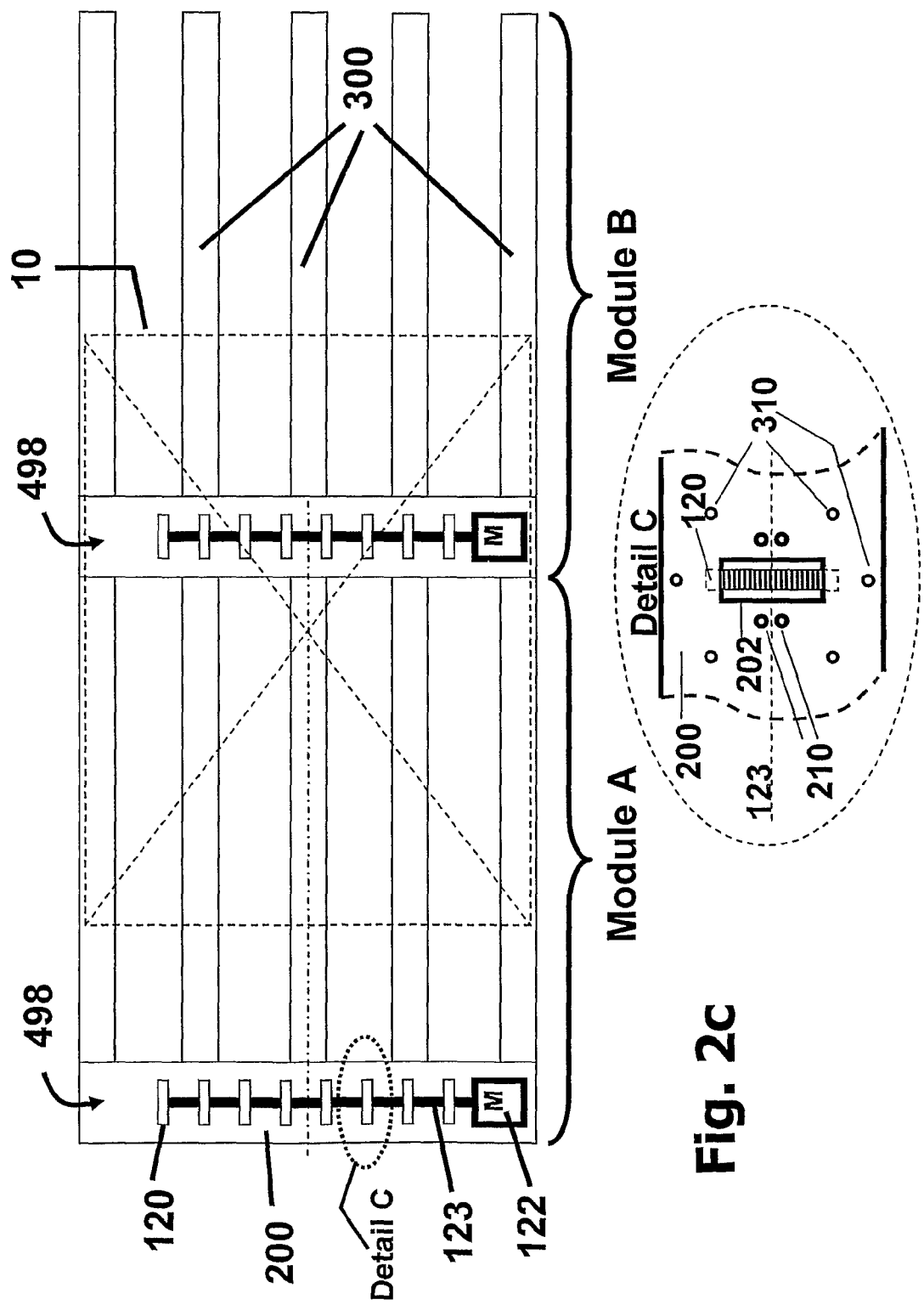
FIG. 2c is an elevated view of a long VPL-conveyor system according to a preferred embodiment of the present invention. It has two lateral rows of side-by-side vacuum preloaded drive wheels, incorporated with non-contact support elements.

A main aspect of the present invention is the provision of a conveyor system for handling or for accurate linear motion of generally flat objects with enhanced conveying performance. In particular, this system is associated with AM-platform and conveying modules, where the object is being supported without contact over an air cushion. In particular, "object" with respect to the present invention relates to thin (thus relatively flexible) and wide-format substrates such as, for example, Flat Panel Display (FPD) glass (typically of 0.4-1.2 mm width, and up to 3200 mm by 2600 mm, Generation 10 glass) and Solar-Cell substrates (Glass or Silicon). Enhanced conveying performance is achieved by adding vacuum ports in the vicinity of one or more of the drive wheels to establish vacuum preload. As a vacuum holding down force is added to gravity the loading force acts on the vacuum preload wheels is increased and accordingly lateral driving (friction) force is increased (depending on the coefficient of friction between the substrate and the wheel). When adopting the vacuum preload concept, gravity may become only a minor contributor to the overall driving force. It is of significant importance with respect to AM-platform as the substrate bodyweight is mainly carried by an air-cushion. By using the vacuum pre-load concept for preloading the drive-wheels of conveyers or drive-wheels of linear (or rotational) motion systems, including accurate linear motion systems, decoupling the conveying forces from gravity is established. Accordingly, some applications of the present invention involve non-horizontal substrate handling.

Application of the present invention is suitable both in conveying systems employing drive-wheels both for supporting and conveying objects, and particularly in conveying systems where aeromechanical (AM) support means (non-contact—NC—platforms that generate an air-cushion to support the substrate) are used for supporting the substrates while conveyed over the platform driven by the vacuum-preload drive-wheels.

The present invention brings about the ability to allow drive force enhancement and force control, offering high performance conveying for AM-systems (NC-conveying equipment and NC-platforms, including NC-platforms for process machines where accurate linear motion systems are needed), which has particular relevance for wide-format thin substrates such as FPD and other similar flat objects. By adopting the vacuum preload concept for drive-wheels, the non-flatness of wide-format thin substrates while it is conveyed (i.e. in motion), can be reduced by as much as a factor of 10 with respect to conventional wheels conveyors.

The driving mechanism of the vacuum-preload conveying systems according to the present invention requires much less drive wheels, typically two rows are needed (each of the rows is a vacuum preload drive-wheels unit), with respect to six to ten rows in conventional conveyors for Generation 8-10 FPD glass, when the conveying systems adopts the wheel-after wheel configuration. Alternatively, a row of 8-16 side-by-side drive-wheels having a common shaft (which we refer to as a vacuum preload drive-wheels unit) is needed, with respect to 150-250 wheels in conventional conveyors for Generation 8-10 FPD glass.

In some embodiments of the present invention, AM-platforms are involved. In this case when using conventional wheels conveyors, there is a need to lift the wheels in order to load the conveying system (as gravity is the only down force), but when adopting the vacuum preload there is no need for lifting the wheels. In addition, as a result of the limited drive force when only gravity is involved, much high conveying speed and speed rump-up (i.e. acceleration) in a reliable and safe manner can be achieved using vacuum preload drive-wheels conveyors. Accordingly, the enhanced vacuum pre-load conveyers according to the present invention are cost effective and faster, offering less contact and contamination. The vacuum preload conveyers of the present invention can be very useful for substrate handling over non-contact platforms, for example loading and unloading operations and/or establishing accurate linear-motion of the substrates over an AM-platform as a process is being executed. It can be also very useful for transportation and automation modules across the FPD or Solar-cell manufacturing lines (i.e. cost effective handling of substrate such as FPD or Solar-cell substrates between process machines).

The essential principle of the vacuum pre-load (VPL) conveyer is illustrated in FIG. 1a, with respect to a preferred embodiment of the present invention. VPL is applied to enhance the conveying performance (mainly in terms of driving force) of conveyers (such as the wheel-conveyor shown in FIG. 2a). An object 10, such as a thin and flexible substrate (for example a flat panel display—FPD, or a Solar-cell substrate) is supported and conveyed forward by the wheels-conveyor (see FIG. 2a). However, it has to be emphasized that although attention is made to substantially flat, thin and flexible substrate, the VPL concept in general is capable of conveying a wide verity of objects. FIG. 1a is a cross sectional view of a typical wheels-conveyor where at one or more of the rows of drive-wheels (see 400a, FIG. 2a) the VPL concept is applied while other rows of drive-wheels (wheels 120a) are standard rows (i.e. without VPL). In order to apply linear motion for linearly conveying the substrate forward, all wheels are driven by a common shaft 123 connected to drive mechanism 122.

In conventional wheels-conveyor, the horizontal driving force (i.e. normal to gravity) is determined by the body weight (Fg) of the object multiplied by the friction coefficient between the wheels 121 and the substrate 10 that is typically made of non-metallic clean-room compatible material. In order to enhance and/or to control the horizontal driving force, the VPL concept is applied in the vicinity of drive-wheel 120 of rows 400 (see FIG. 2a). A counter plate 200 is adjacent to wheel 120 where one or more vacuum suction ports (210) are positioned to increase the normal force between the substrate and wheels 120. The counter plate is adjusted to be lower than the top of wheel 120 with a typical gap in the range of 50 to 500 micrometers. When ports 210 are connected to a vacuum source (not shown in the figure), a sub-atmospheric pressure is induced in a substantially thin volume 201 between the counter plate 200 and the substrate 10 that is supported by wheel 120. Accordingly the wheel 120 is subjected to a much higher holding down force (Fv) with respect to the gravity force (Fg). Practically, when applying the VPL concept (for example to only 2 of 5 rows as shown in FIG. 2a), Fv can be larger (the higher the vacuum level and the smaller the gap is, the larger the holding down force is), by a factor of 2-10 (and more if needed), with respect to Fg.

FIG. 2a illustrates, in accordance with a preferred embodiment of the present invention, a top view of a Wheels conveyor module having five rows of wheels that support substrate 10, where in the two side-rows 400 the VPL concept is applied (rows 400a include conventional drive-wheels 120a). The conveyor is supported by a base structure (not illustrated) at a desired height above the floor (with leveling capability). All rows are driven by a common shaft 123 connected to drive unit 122. All the wheels of each of the five rows (i.e. including the two side rows where the VPL is applied) are driven by a flexible belt 140 being in tension. It has to be emphasized that, there are many options to apply motion to the wheels and belt drive is only one example (timing belt can be also applied, or it can be a mechanical or magnetic mechanism as known in the art—to mention a few).

FIG. 2b illustrates, in accordance with another preferred embodiment of the present invention, a top view of an Aeromechanical conveyor module having (similarly to the wheels conveyor of FIG. 2a), two side-rows 400 for driving the substrate where the VPL concept is applied (rows 400a include conventional drive wheels 120a). These two rows are driven by a common shaft 123 connected to drive unit 122. However, instead of the three internal rows of wheels of the wheels conveyor, three elongated aeromechanical (AM) supporting "rails" 300 are provided. AM-rails 300 support the substrate 10 without contact (see FIG. 1b) by an air cushion that is developed between the AM-rails 300 top surface and the substrate 10. The body weight of the substrate 10 is supported both by the two rows of wheels 400 and by the three AM-rails 300. Accordingly the driving force due to body weight (that is linearly related to the down force applied on the wheels that support only part of the substrate weight) is reduced (and may also be not constant), thus the VPL concept, where gravity can be of minor importance, is more effective with respect to linear drive force enhancement of AM-conveyors.

FIG. 1b illustrates the implementation of the VPL concept for AM-conveyors, with respect to another preferred embodiment of the present invention, aimed at enhancing and/or controlling the driving force of AM-conveyors (as shown, for example, in FIG. 2b). FIG. 1b is a cross sectional view of a typical AM-conveyor where in on one or more drive-wheels rows (see 400, FIG. 2b) the VPL concept is applied in order to increase the driving force. The AM-rails 300 are applied to support substrate 10 without contact by an air cushion 301 (such as, for example, PA-type air-cushion, see WO 03/060961, incorporated herein by reference. PA-type fluid-cushion is generated using a support surface with a plurality of pressure ports, and evacuation vents, where fluid is allowed to evacuate into the surroundings.) that is fed by air through pressure ports 310. Typical air-gaps of air-cushion 301 are in the range between 100 to 500 micrometers (as larger the gap the larger is the Mass Flow Rate—MFR). The VPL concept implementation for drive wheels 120 is similar to drive-wheels 120 of FIG. 1a.

FIG. 1c illustrates local implementation of the VPL concept, with respect to another preferred embodiment of the present invention, where two small counter plates 200 with one or more vacuum ports 210 are provided from both sides of the drive wheels 120, typical distance of the vacuum ports from the wheels is in the range of 8-15 mm where the counter plates 200 are placed in a distance of 1-2 mm from the wheels (50-500 micrometer down from the wheels tips). Typical diameter of the vacuum port is in the range of 2-6 mm. Typical vacuum level provided to the vacuum port is in the range of 500-900 mbar (absolute).

FIG. 1d illustrates a common implementation of the VPL concept, with respect to another preferred embodiment of the present invention. One common counter plate 200 is used for a row of drive-wheels (wheel-after-wheel configuration shown in FIG. 1d). wheels 120 are located at the center of slits 202 created through counter plate 200 where the wheels tips are some 50-500 micron above the top surface of counter plate 200. In addition to the one or more vacuum ports 120 created in counter plate 200, located beside each of the wheels 120, a plurality of pressure ports 310 is provided in order to prevent contact, in particular when flexible substrate such as FPD glass is conveyed. Typical width of the counter plate 200 in such configuration is 80-120 mm, where the pressure ports 310 (that in fact induce air-cushion support), are located at a typical distance that is longer by a factor of 4-8 and more from the wheels tip, with respect to the distance between the vacuum ports and the close wheel tip.

It has to be emphasized that this configuration can be regarded as a stand-alone or a Plug-and-play "VPL-conveying unit" as it can be incorporated with several conveying modules.

This allows fast removal and replacement of a malfunctioning VPL-conveying unit with another, or easy and convenient maintenance.

FIG. 1e illustrates an implementation of the VPL concept, with respect to another preferred embodiment of the present invention, a configuration where the counter part is an integral part of an AM-platform (i.e. made of one part). In this integral-configuration, the counter plate 200 of the VPL-conveyor is created between two sections 300a of a non-contact support platform that generates air cushion support below the substrate (for example, the PA-type air-cushion). It is clearly shown that between the elongated sections 300a and 200 an elongated surface grooves 381 with evacuation to atmosphere holes 382 are created in order to establish a local-balance—(see WO 03/060961, incorporated herein by reference), in order to keep a wide format substrate flat. All other details regarding the VPL-concept are similar to the explanations provided with respect to FIG. 1d.

FIG. 2c illustrates an implementation of the VPL concept, with respect to another preferred embodiment of the present invention, a configuration where the VPL-conveyors has a side-by-side drive-wheels 120 with a common shaft 123 that is perpendicular to the direction of motion. FIG. 2c shows two consecutive VPL-conveying modules (A and B), each of the modules includes one crossing VPL-conveyor unit 498 and five non-contact supporting AM-rails 300 (for example based on PA-type air-cushion). Each of the crossing VPL-conveyor units 498 has one counter plate 200 and a row of side-by-side wheels 120 having a common shaft 123 that is directly connected to motor 122. The distance between wheels can typically be from 60 mm and more (the more wheels the greater the drive force but MFR is increased), and where needed the distance between wheels may not be uniform. Detail C shows that close to each of wheels 120 both vacuum ports 210 and pressure ports 310 are provided. It has to be emphasized that in order to enable smooth motion over the modules, the distance between the shafts (i.e. between 123 of A and 123 of B), has to be slightly shorter (typically by 50 to 100 mm) from the length of the substrate 10.

Figure 2D:
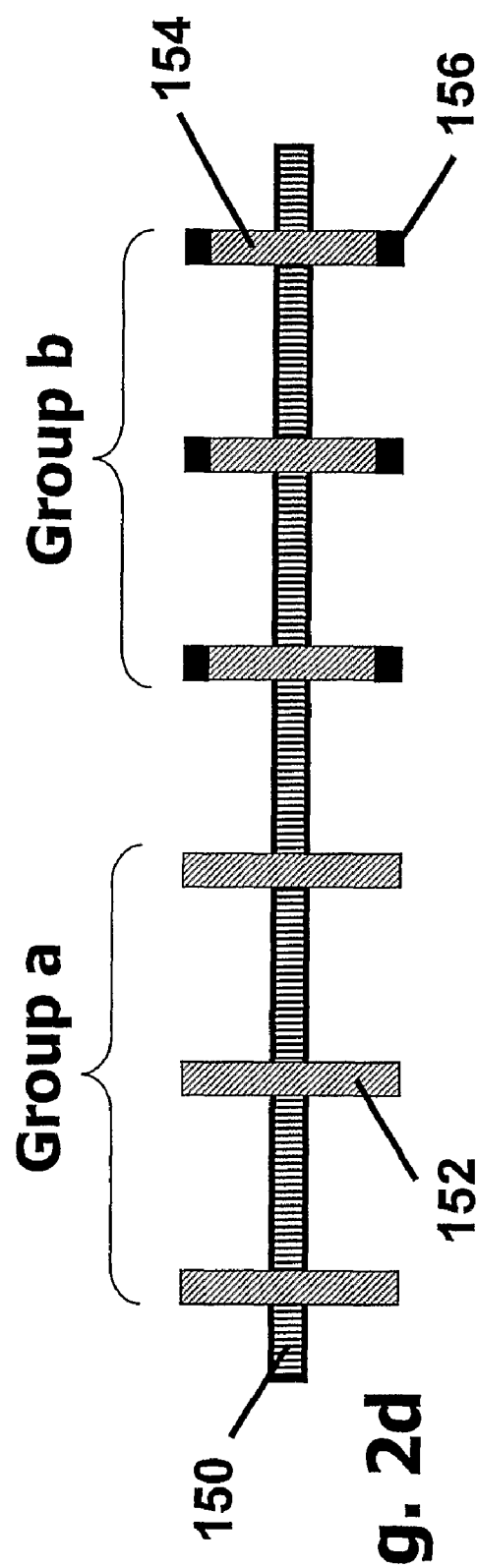
FIG. 2d is a side view of the side-by-side row of drive-wheels shown in FIG. 2c.
Figure 2E:
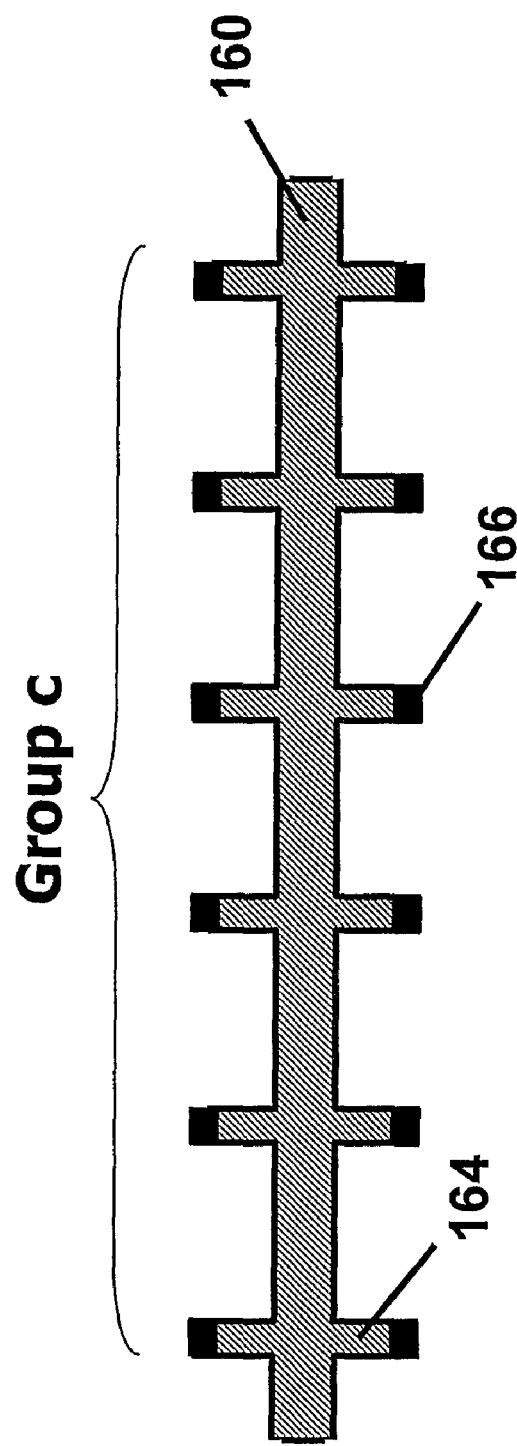
FIG. 2e is a cross-sectional view of the side by side row of drive-wheels shown in FIG. 2c, to be used when accurate substrate motion is required.

FIG. 2d illustrates a row of side-by-side VPL drive-wheels 152 and 154 engaged with a common shaft 150. The wheels are divided into two groups. In Group A, the wheels 152 are created from one material (typically metal, produced in machining). In Group B the wheels are created from two materials, the inner part 154 that can be made for example from metal and an outer part 156 with contact surface that can be created from clean-room compatible material, for example, PEEK (non-metallic) that is characterized by high coefficient of friction when it is in contact with glass. (It is clear that either group A or B will be applied in one wheels row). This kind of design provides rigidity and allows replacing part 156 when needed. Such rigidity is very important when high accuracy linear-motion mechanism is required as shown in FIG. 2e. FIG. 2e shows the wheels 164 with outer part 166 and shaft 160 of a crossing VPL-drive mechanism. The following process may be implemented in order to high accuracy:

The wheels 164 and the shaft 160 are produced in machining from the same material (one part, typically metal).
Assembly of outer ring 166 is followed.
Finally, a second machining phase of the outer contact surface is done.

Yet accurate machining is not all that affects the final product, for bearings and drive also affects the straightness of motion and velocity fluctuations.

Figure 2H:
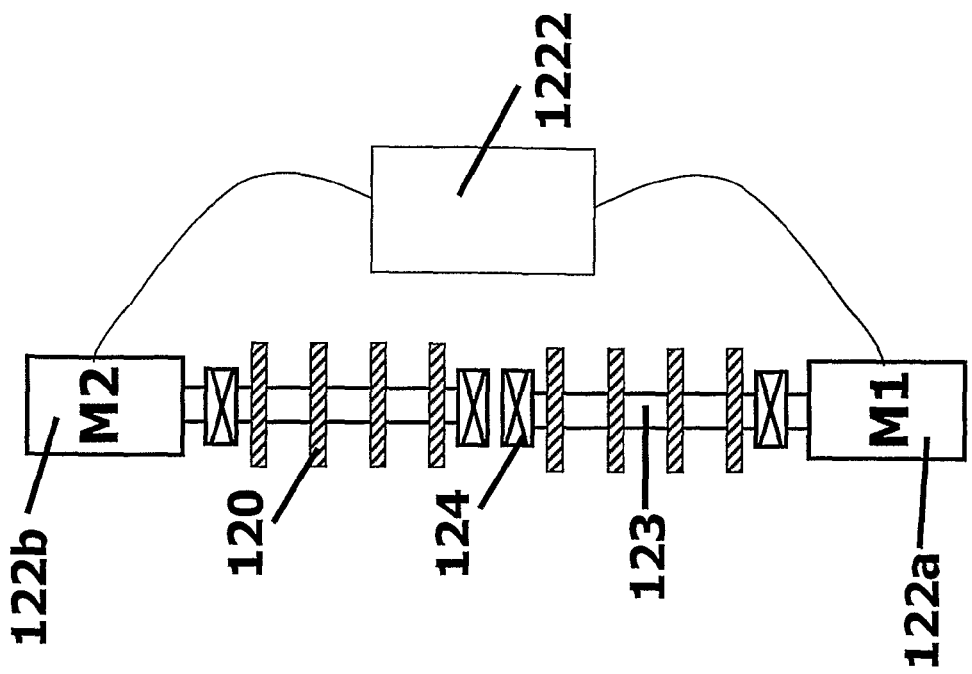
FIG. 2h is a top view of a mechanism of a side-by-side row of drive-wheels divided into two aligned sections. Each of the sections is operated by a dedicated direct drive motor to allow both synchronization during straight motion and during rotation (to control straightness of motion).
Figure 2G:
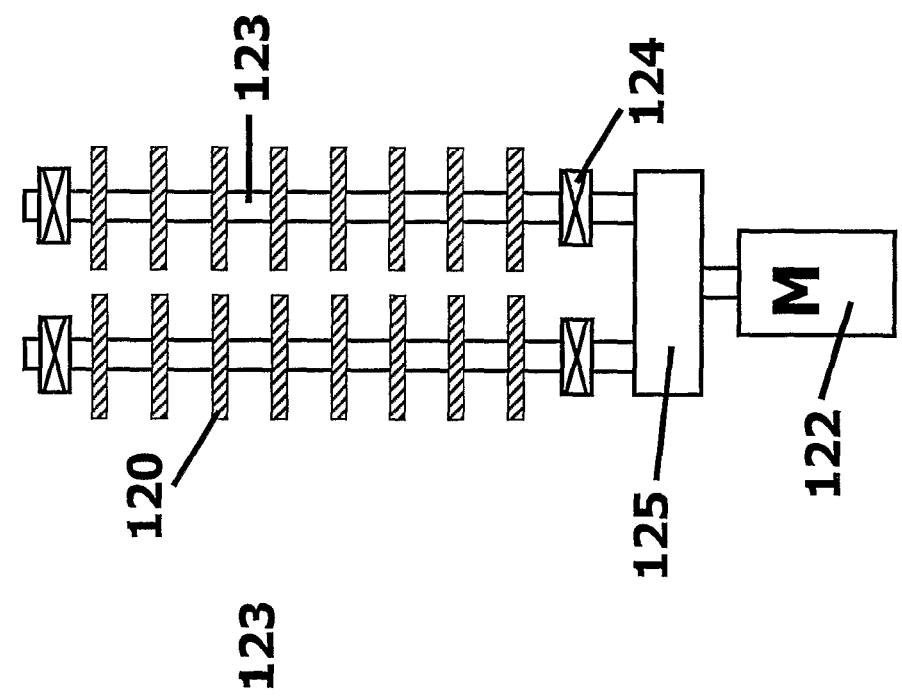
FIG. 2g is a top view of a mechanism of two parallel rows of side-by-side drive-wheels engaged by a transmission box and operated by common motor.
Figure 2F:
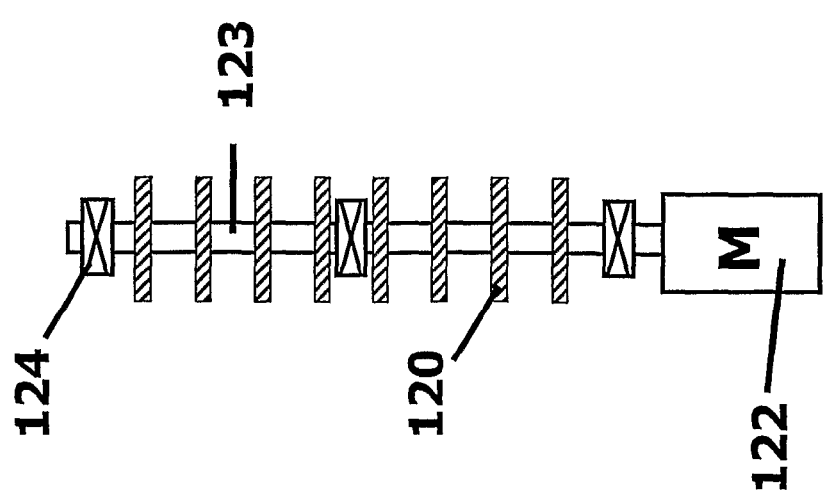
FIG. 2f is a top view of a mechanism of a side-by-side row of drive-wheels shown in FIG. 2c having direct drive motor and ball bearing support for the common shaft of the wheels.

FIGS. 2f-2h illustrate, with respect to a preferred embodiment of the present invention, several optional arrangements of crossing VPL-conveyor units for providing accurate substrate handling, FIG. 2f shows a mechanism of a crossing VPL-conveyor having a plurality of wheels 120 and one common shaft 123 directly driven by motion system 122. The system is typically provided with gear box and optionally with an encoder for controlling the motion. AC motors, DC motors and step motors can be used. Shaft 123 is supported at several locations by bearings 124 that are attached to the conveyor module structure (not shown). FIG. 2g shows a mechanism of crossing VPL-conveyor having two parallel shaft 123 (for example such as the design described in FIG. 2e), each supported by bearing 124 from both ends. The shafts are connected to a motion system 122 through a three-yaw transmission box 125. FIG. 2h shows a mechanism of crossing VPL-conveyor divided into two aligned sections. Each section is operated by a dedicated direct-drive motion system (122a, 122b). A motion control unit 1222 is further provided to synchronize the two motion systems during straight motion or to allow fine rotation (to control straightness of motion).

FIG. 3a illustrates, with respect to a preferred embodiment of the present invention, a side view of a "stand-alone" VPL-conveyor 400 (wheel after wheel configuration). The counter plate 200 of 400 is supported by side plate 420 that also supports the housing of bearing 121. The top of wheels 120 typically protrude 50-500 micrometer above the top surface of counter plate 200 (this is achieved, for example, by using set screws for leveling adjustment, not shown in the figure). Openings (slots) 205 are provided in counter plate 200 for the wheels 120. The vacuum ports provided on counter plate 200 and other AM-details are not shown in this figure for brevity (see FIG. 4a). The driving force to rotate the wheels is provided to one of the wheels by shaft 123 and all the wheels are driven by belt 430. Adjusting idlers 425 are provided for maintaining belt tension. The VPL-conveyor 400 is supported by a lifting mechanism 450 and the lifting mechanism 450 is supported by base structure 20. The lifting mechanism may be used to raise and to lower the drive wheels 400 (including the counter plate).

FIG. 3b illustrates, with respect to a preferred embodiment of the present invention, a side view of a VPL-conveyor 400a (wheel after wheel configuration). This version is very similar to the "stand alone" VPL-conveyor 400. The difference is that in case of the embodiment shown in FIG. 3b, only the drive mechanism is lifted up and down, while the counter plate 200a remains stationary, optionally being an integral part of an AM-platform (see FIG. 1e). Other details are similar to the details described with respect to FIG. 3a.

Figure 4A:
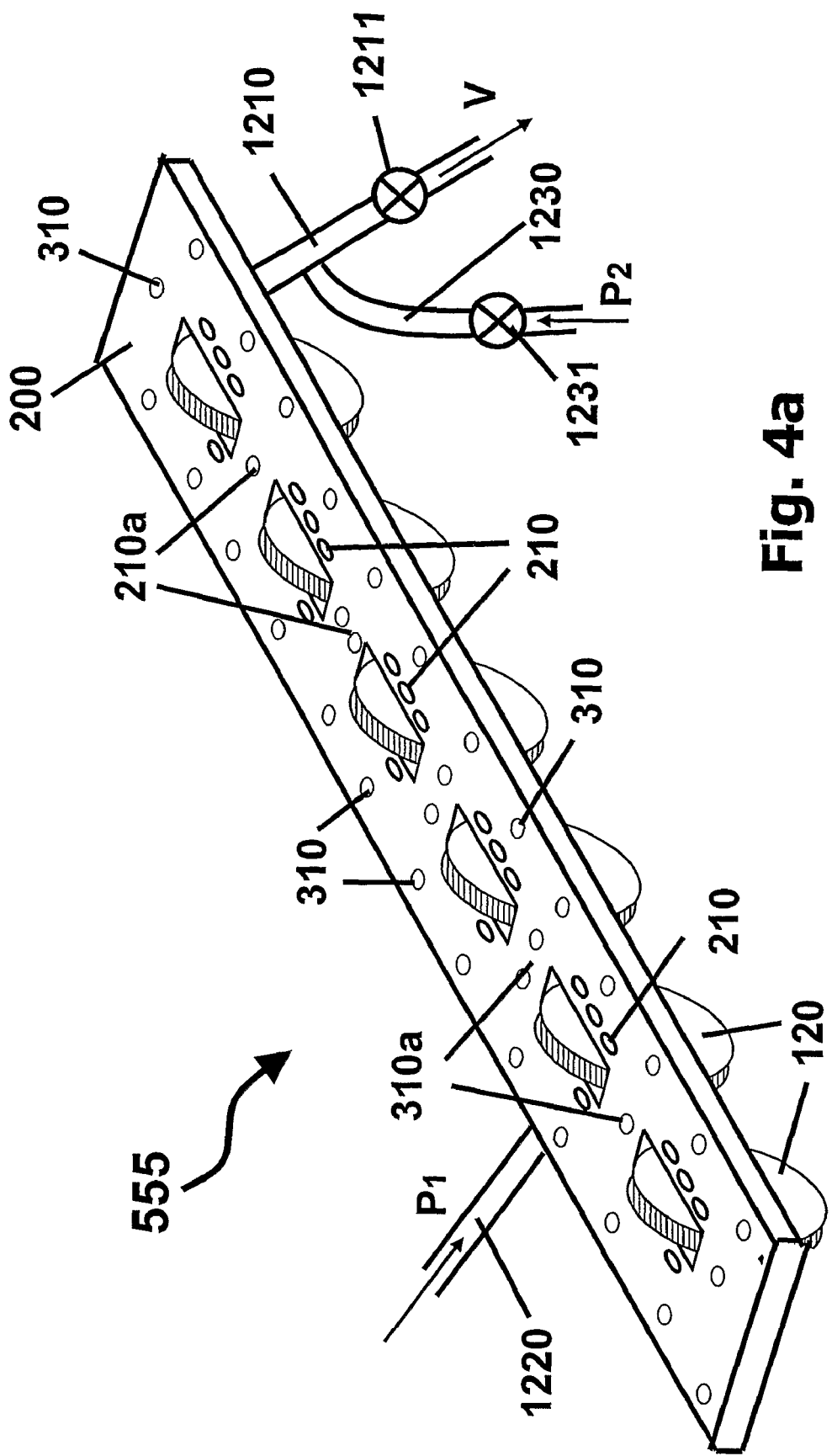
FIG. 4a illustrates an isometric view of a "stand alone" VPL-conveyer (wheel after wheel configuration), according to a preferred embodiment of the present invention.

FIG. 4a illustrates, with respect to a preferred embodiment of the present invention, a general view of a "stand-alone" VPL-conveyor 555 in a wheel-after-wheel configuration. The VPL-conveyor 555 includes a counter plate 200 and a row of driving wheels 120. Beside each of the wheels or between wheels (210, 210a), at least one vacuum port is provided to apply a holding down vacuum force (the VPL concept). The number of vacuum ports and the location of the vacuum ports are predetermined with respect to the flexibility of the substrate and by the desired drive-force. However, when the substrate is flexible, it is necessary to add pressure ports 310 at the edges of the counter plate 200 and also between the wheels (310a, and in this case instead of vacuum ports 210a) in order to create air-cushion support aimed at preventing contact due to substrate sagging (when holding down bending forces are induced by the vacuum ports). VPL-conveyor 555 is provided with main vacuum-pipe 1210 to supply vacuum to each of vacuum ports of 555. The main vacuum pipe-line 1210 is connected to a vacuum source (not shown) through valve 1211 to enable various operative modes. The VPL-conveyor 555 is further provided with a main pressurized-air pipe-line 1220 to supply air to each of pressure ports of 555. Optionally, the VPL-conveyor 555 is further provided with another pressurized-air pipe-line 1230 that is communicates with the main vacuum pipe-line 1210 through controlled valve 1231. This arrangement is offered for securing non contact, to be explained hereinafter with respect to FIG. 6c.

FIGS. 4b and 4c illustrate, with respect to a preferred embodiment of the present invention, a general view of a "stand-alone" VPL-conveyor 555a where a side-by-side wheel configuration is provided. FIG. 4b illustrates a top view of a VPL-conveyor 555a. It includes a counter plate 200 and a row of side-by-side vacuum-preload driving-wheels 120, positioned in slots 202 provided on counter plate 200. Beside each of the drive-wheels one vacuum port is provided to apply vacuum holding down forces. However, when the substrate is flexible, it may be necessary to add pressure ports 310 at the edges of the counter plate 200 and also between the wheels. FIG. 4c illustrates the VPL-conveyor 555a mechanism that is covered by the counter plate. It is clearly seen that the drive-wheels 120 of 555a have common shaft 123 that is directly connected to a motorized system 122 (a motor & gear for example), where the shaft is supported by bearing 124 to the counter plate 200 (illustrated by the dash line).

Figure 4D:
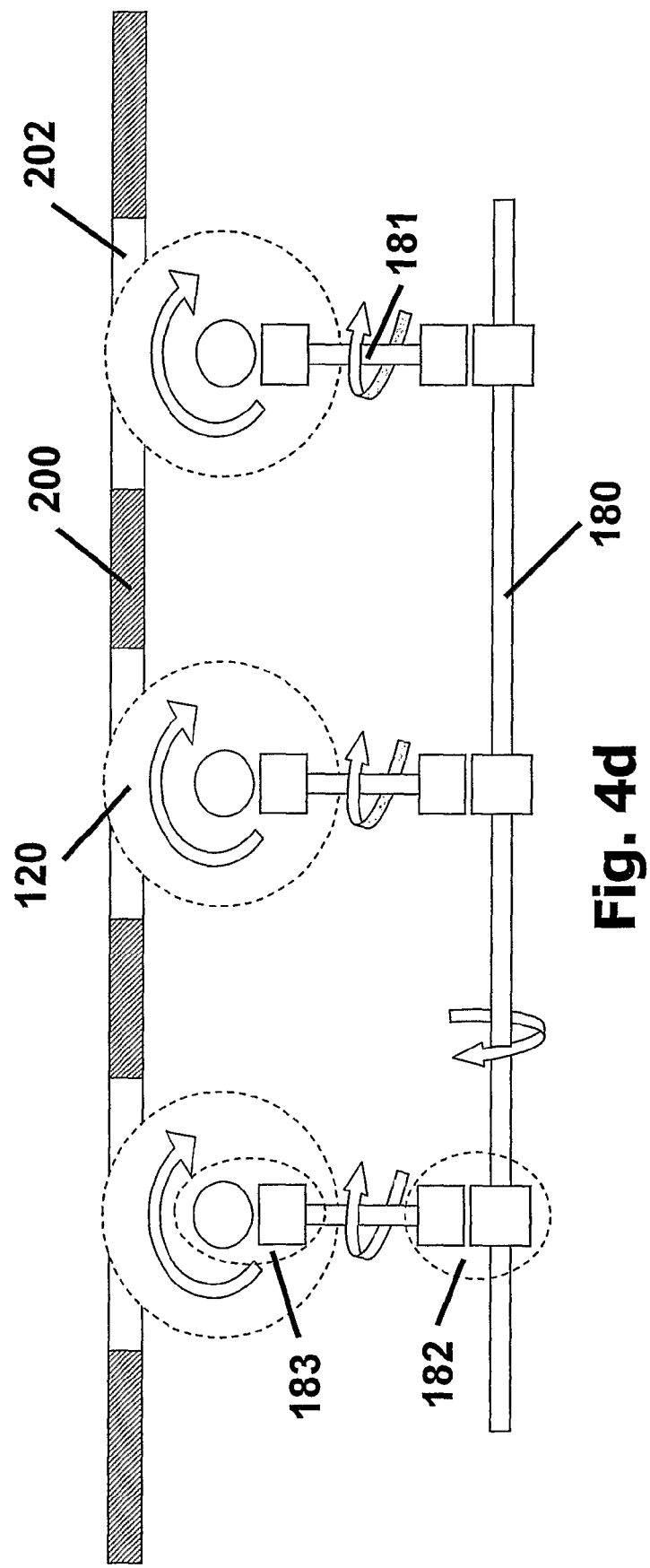
FIG. 4d illustrates an isometric view of a row of wheels of a VPL-conveyer, according to a preferred embodiment of the present invention, equipped with magnetic transmissions.

FIG. 4d illustrates, with respect to a preferred embodiment of the present invention, an optional drive-mechanism based on magnetic transmission units for VPL-conveyors that are operated in clean room environment (for example, to be the drive mechanism of the VPL-conveyor shown in FIG. 4a). A common shaft 180 is connected to crossing shaft 181 (one for each drive-wheels) by magnetic transmission unit 182. A second magnetic transmission unit 183 is provided between 181 and each of the drive-wheels 120.

Figure 5B:
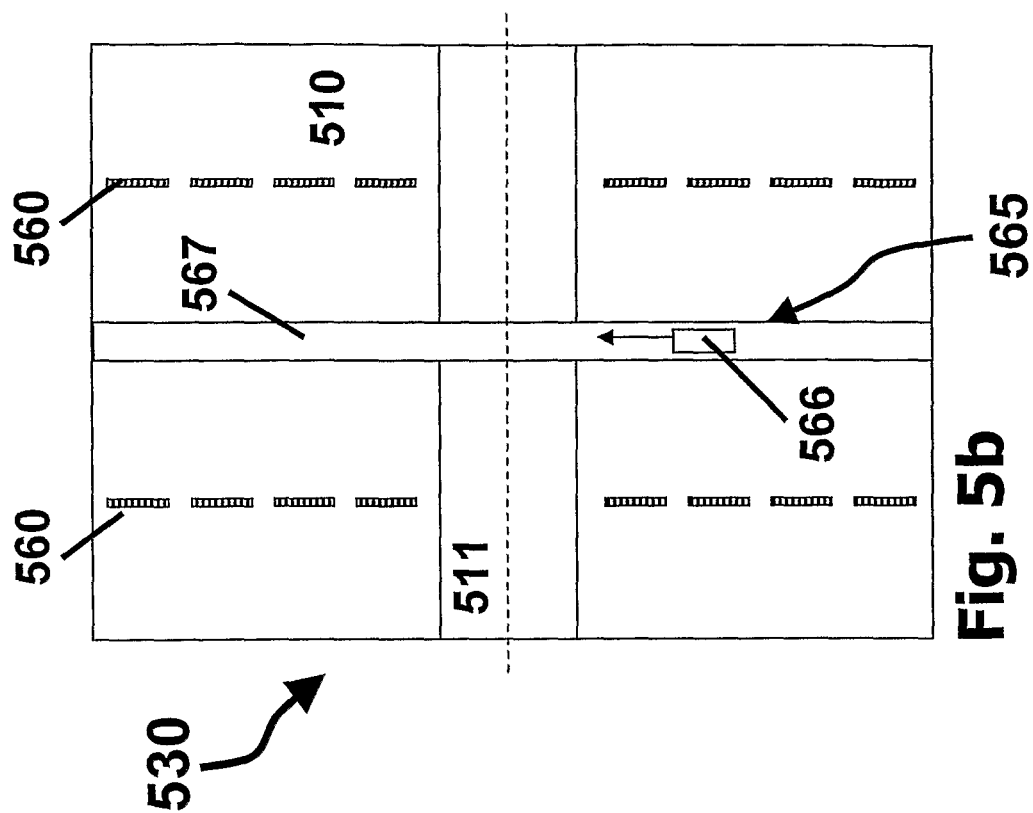
FIG. 5b illustrates an elevated view of a VPL-conveyer, according to a preferred embodiment of the present invention, where the counter plate is an integral part (or a section of) an AM-platform.
Figure 5A:
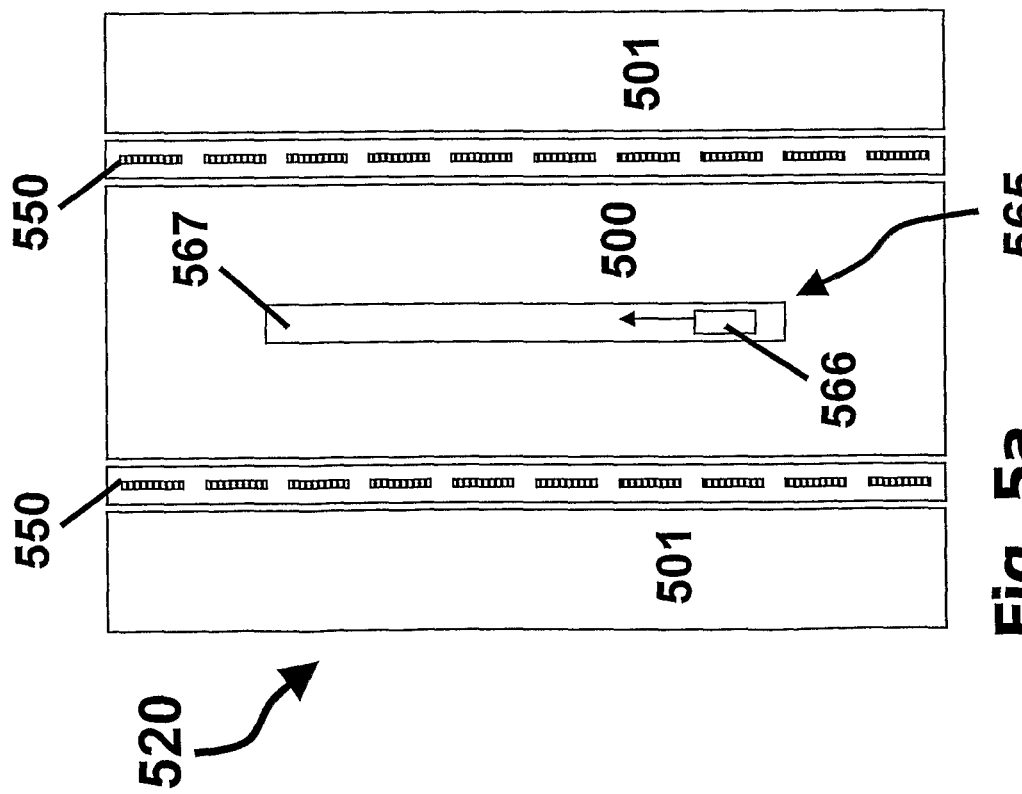
FIG. 5a illustrates an elevated view of a "stand-alone" replaceable (plug-and play) VPL-conveyer, according to a preferred embodiment of the present invention, incorporated with an AM-platform.

FIG. 5a illustrates, with respect to a preferred embodiment of the present invention, a top view of a non-contact (NC) AM-platform of process systems, equipped with a "plug and play" VPL-conveying module. The NC AM-platform 520 includes two replaceable VPL-conveying units 550 (see also 555 at FIG. 4a) with lifting mechanism (see FIGS. 3a-b), and three AM-sections 500 and 501. The AM-platform 520 may apply, for example, a PA-type air-cushion. In between 500 and 501 an elongated slots are created for hosting the "plug and play" VPL-conveying units 550. The two VPL-conveying units 550 are placed internally for supporting substrates of different width (yet wider than the distance between the two units 550 in order to allow continuous motion across the system). The two parallel aligned VPL-conveying units 550 of platform 520 are operative during loading and unloading sequences or when by-pass mode is operated. After being loaded the substrate is clamped by a precise linear-motion mechanism 565 having vacuum pad 566 for clamping the substrate and elongated slider positioned below an elongated slot 567 that is created at AM section 500 (after claming by pad 566, units 550 are lowered by the lift mechanism). At operative mode when accurate motion is required, the linear-motion mechanism 565 handles the glass and when the process is complete the VPL-conveyers are lifted up and operate again for unloading the substrate. This procedure is compatible for process systems that serve an in-line manufacturing FAB.

FIG. 5b illustrates, with respect to another preferred embodiment of the present invention, a top view of an AM-platform 530 similar to platform 520 (see FIG. 5a), equipped with an integral VPL drive-unit 560. By "integral" is meant that the top surface 510 of the NC-platform 530 and the counter plate of the VPL drive unit 560 comprise a common plate. All other details are mostly similar to the platform described with respect to FIG. 5a. In this case, each the driving wheels of unit 560 is aligned protruding (for example 100 micron) above the top plate of NC-platform 530 (100 micron is related to half or less of the typical air-gap of the air-cushion that support the substrate across the non-contact platform 530). In the center of the AM-platform 530, an accurate process zone 510 is provided for obtaining accurate floating gap of the substrate, for example, by applying the PV-type air-cushion. With respect to the AM-platform 520 (FIG. 5a), notice that in this case, the VPL drive unit 560 is divided into two sections and does not penetrate the process zone area. As a result, disturbances that may be generated by the drive-wheels of 560 from being induced to the process area 510 are prevented. However, further notice that the linear-drive system 565 is crossing the process area, and accordingly the overall accuracy of the platform (i.e. flatness of the substrate) is dictated also by the drive system 565.

Accordingly in an operative mode, when the integral VPL drive-unit 560 is used (for example) for loading and unloading of a substrate, the vacuum ports of VPL drive unit 560 are fluidically connected to a vacuum source, and as a result, the flexible substrate (for example such as 0.7 mm thickness FPD glass), is sagging by vacuum pull down force and contact at a desired down force is created between the substrate and the facing top surface of the driving wheels. When it is not operative, vacuum supply is closed and the substrate is pushed up by the surrounding air-cushion and the substrate safely levitates above the top of the driving wheels (see also FIGS. 6a-c). Accordingly, in selective applications lifting mechanism (and time spending) may be avoided (but in some other applications, lift mechanism for the wheels must be applied).

Figure 6A:
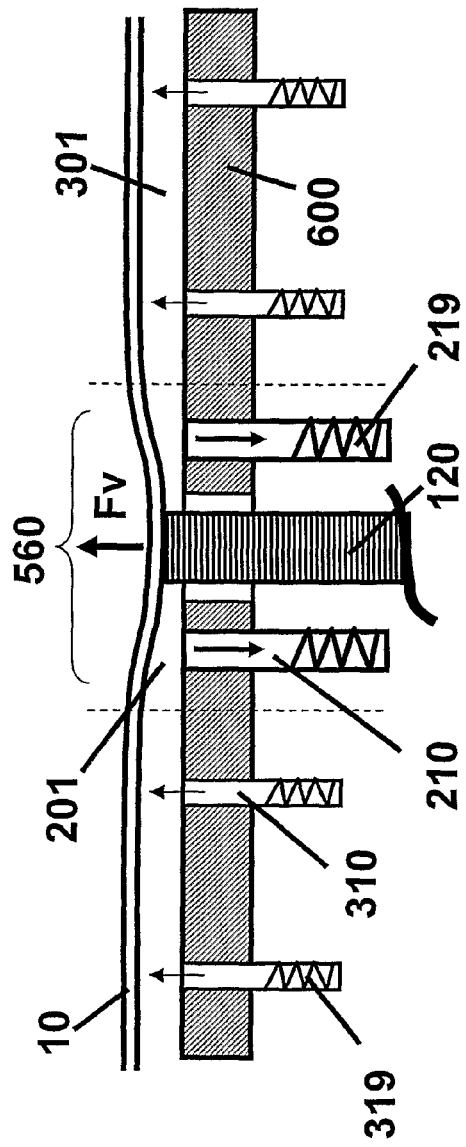
FIG. 6a illustrates an operation mode of a VPL-conveyer, according to a preferred embodiment of the present invention, employing an air-cushion for supporting the conveyed substrate and vacuum for enhancing friction force.
Figure 6B:
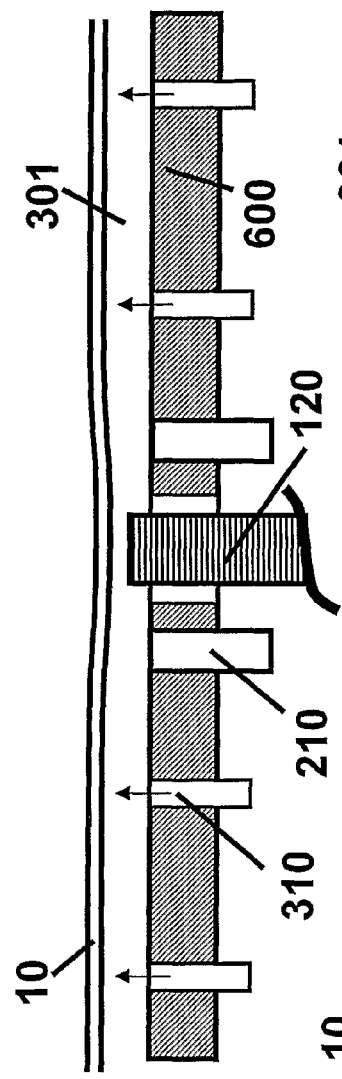
FIG. 6b illustrates a passive mode of a VPL-conveyer, according to a preferred embodiment of the present invention, employing air-cushion for supporting the conveyed object (vacuum is not provided).
Figure 6C:
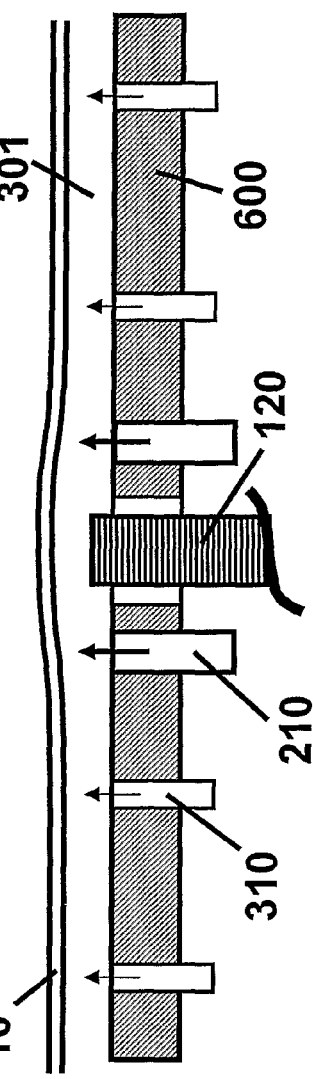
FIG. 6c illustrates a safe mode of a VPL-conveyer, according to the present invention, where pressurize-air is supplied through the vacuum port in order to lift the substrate further away (upwards) from the wheels.

More on the operational modes of the integral VPL drive-unit 560 is illustrated in FIGS. 6a-c, according to preferred embodiments of the present invention, where a lifting mechanism for a VPL-conveyor unit 560 is unnecessary. Cross sectional view of the NC-platform 600 in the vicinity of the unit 560 is shown in FIG. 6a. In this figure vacuum is supplied to the vacuum ports 210 on either sides of the wheel 120. Accordingly, sub-atmospheric conditions at volume 201 develop and a flexible substrate 10 (for example wide format 0.7 mm FPD glass), is pulled down and sags from nominal levitation (see FIG. 6b), so the substrate 10 is held down to contact with wheel 120 at a desired down force (Fv). Around the unit 560, the NC-platform 600, having a plurality of pressure ports, creates an air-cushion 301 to support substrate 10 preventing contact between substrate 10 and the top surface of the NC-platform 600. FIG. 6b is similar in all of its elements to FIG. 6a, but vacuum is not supply to the vacuum ports of the integral VPL drive unit 560. In this situation (nominal levitation), the substrate 10 may slightly sag due to gravity but still the air-cushion 301 created by the NC-platform 600 around the unit 560 support substrate 10 at safe levitating distance from the top of wheel 120. However, FIG. 6c describes the option to further increase the safety distance between the substrate 10 and the top of wheel 120. It can be done by switching from vacuum supply (connected to the vacuum ports of unit 560) to pressurized-air supply in order to get more push up forces close to the vacuum preload drive-wheels. This extended safe-distance depends on the applied pressure level. Accordingly, just by switching on/off of the vacuum supply to the vacuum ports of 560, contact between the substrate 10 and the vacuum-preload drive wheels 120 is established and lateral drive force is created.

As the substrate is conveyed and covers only part of the VPL drive unit, significant number of vacuum ports are uncovered, exposed to the surrounding pressure condition (i.e. atmospheric conditions), and accordingly mass flow rate (MFR) may significantly increased. In order to prevent unnecessary lost of mass flow, it is an option to use a flow restrictor 219 (FIG. 6a) fluidically communicating with each of the vacuum port of the VPL drive unit 560, thus limiting the flow when the vacuum port is uncovered. Such flow restrictor may be a SASO flow restrictor (see WO 01/14782, U.S. Pat. No. 6,644,703, and U.S. Pat. No. 6,523,572, all incorporated herein by reference) may be used. The NC-platform according to a preferred embodiment of the present invention is also equipped with flow restrictors 319 (such as SASO nozzle or similar) in each of the vacuum ports 310 in order to limit overall flow rate and to provide significantly high resistance to contact.

FIGS. 7a-d, illustrate, with respect to some prefer embodiments of the present invention, some configurations of AM-platforms equipped with one or more integral VPL drive unit with a wheels-after-wheel configuration (see FIG. 3a). Such a platform may include precise linear drive system as described in FIG. 5a. FIG. 7a illustrates a NC-platform 701 equipped with VPL drive unit 710. Unit 710 has two rows of driving wheels at the sides of platform 701. FIG. 7b shows a NC-platform 702 equipped with VPL drive unit 720. Unit 720 has two adjoined rows of driving wheels at the centerline of platform 702. FIG. 7c illustrates a NC-platform 703 equipped with VPL drive unit 730. Unit 730 has two rows of driving wheels in platform 701. FIG. 7d describe a NC-platform 704 equipped with VPL drive unit 740. Unit 740 has 3 rows of driving wheels, two at the sides of platform 704 and one at the centerline of platform 704.

FIGS. 7e-h, illustrate, according to some prefer embodiments of the present invention, some configurations of accurate PA-PV (2100-2200) AM-platforms equipped with one or more integral VPL-drive units 770 with wheel-after-wheel configuration (see FIG. 4a) for conveying missions such as loading an unloading and passing, or side-by-side wheel configuration 780 (see FIG. 4b) for conveying missions and an accurate system version 790 (for example, the VPL-drive units shown in FIG. 4b that is equipped with the shaft shown in FIG. 2e), for providing precise linear motion to be an optional replacement to the precise linear-motion mechanism 565 described in FIG. 5a. The AM-Platforms in FIGS. 7e-7f are PA-PV-PA type where a laterally elongated processing zone is positioned at the center of PV area 2000. In these cases the substrate stroke is slightly longer that substrate length. FIG. 7a has two conveying units 780 for loading and unloading positioned at the upstream and the down stream of the platform. The two precise units 790 are synchronically operated and drive the substrate forward (or backwards if needed) as a process over the substrate takes place. FIG. 7f is similar to 7e but instead of using units 780, VPL-drive units 770 (in a wheel-after-wheel configuration) are provided. The AM-Platforms in FIGS. 7g-7h are PA-PV-PA-PV-PA type where two laterally elongated process zones are positioned at the center of PV areas 2000 having a distance of about half substrate length. In these cases substrate stroke is lightly longer that half substrate length. FIG. 7g has one precise VPL-drive unit 790 for accurate handling of the substrate during the process period that may take place simultaneously at both process zones 2200, and two VPL-drive units 780 for loading and unloading. FIG. 7h has 3 synchronically operated precise VPL-drive units 780. Accordingly, accurate motion as well as loading and unloading are done by this 3-shafts drive system.

Figure 7K:
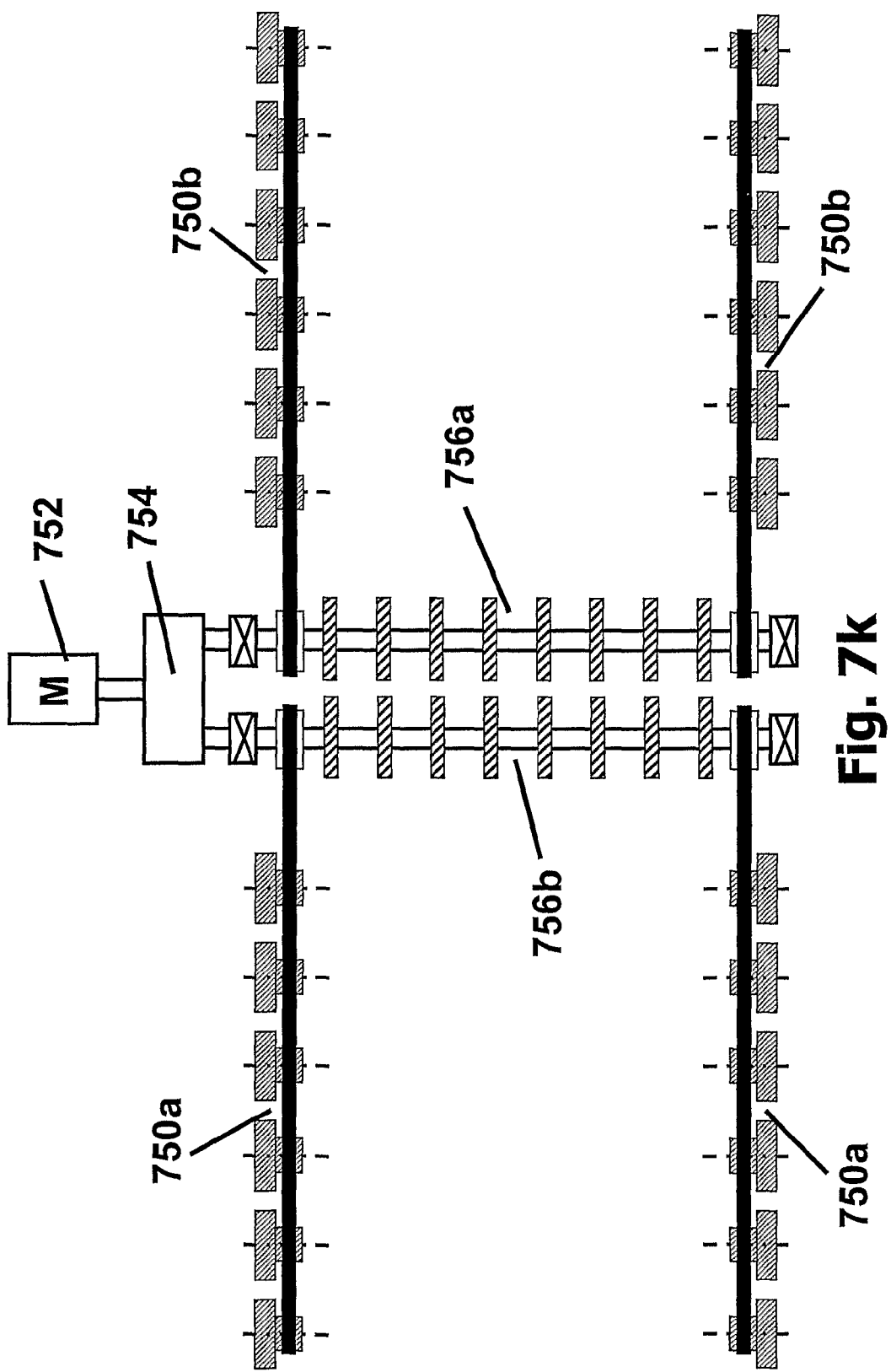
FIG. 7k illustrates a typical mechanism of a VPL-conveyer having both accurate direct drive (side-by side wheels), and loading/unloading VPL-conveyor (wheel after wheel), according to some preferred embodiments of the present invention.

FIG. 7k illustrates, according to a prefer embodiment of the present invention, an optional VPL-mechanism driven by a single motion system 752 having three way gear box 754, optionally being the VPL drive system of the accurate platform as describe in FIG. 7f. It includes two parallel accurate VPL-conveying units 756a,756b (side by side configuration), and loading and unlading VPL-conveying units 750a,750b and (side by side configuration) where drive force is provided via belts by the shafts of units 756a,756b. Note that operating of each of the sectors can be done just by switching the vacuum as will be described in the following paragraph.

It has to be emphasized (see FIGS. 6a-c) that drive force is introduced to the conveyor by introducing vacuum to the vacuum ports of the VPL-drive unit. Switching may be applied in the following partly linked situations:

Vacuum is switched on when the substrate does not cover the vacuum ports

Vacuum is switched on when the substrate covers only some of the vacuum ports

Vacuum is switched on when the substrate covers all the vacuum ports (this is the case with respect to side-by-side wheel configuration)

Vacuum is switched on when the substrate does not move

Vacuum is switched on when the substrate is being conveyed over the platform.

Vacuum is switched on when the drive wheels are not rotating

Vacuum is switched on when the drive wheels are rotating

FIGS. 8a-c illustrate, with respect to some prefer embodiments of the present invention, some configurations of driving wheels to be optionally applied for the VPL concept in general an in particular for integral VPL drive units. FIG. 8a describes a drive wheel 820a to be used in cases where the VPL drive unit is provided at a central area of the NC-platform, below the supported substrate 10. FIG. 8b describes a drive wheel 820b to be used in cases where the VPL drive unit is provided at edges of the NC-platform (see FIG. 7a), and supports the edge of substrate 10. Please note that in order to prevent contact, air-cushion support (310) is provided close to the vacuum ports. A flange 821 of wheel 820a is provided serving as a dynamic guiding element—in order to secure the substrate to be "in-line" during motion. FIG. 8c describes a double drive wheel 820c made as one part where the vacuum ports 210 of the VPL drive unit are located between the wheels (see FIG. 7b). This version is useful in cases where the substrate is very flexible.

Without derogating generality, FIGS. 9a-c illustrate, according to some prefer embodiments of the present invention, some arrangements of vacuum ports around the wheels of VPL drive units. Such arrangements are related to different elastic characteristics of the conveyed substrate. FIG. 9a describes an arrangement of several vacuum ports 911 (three are shown as an example) from both side of the wheel 120. Use of only one vacuum port 912 from both sides of the wheel 120 is very practical as it imposes minimal bending moment on the substrate in the direction of motion. FIG. 9b describes an arrangement of one or more vacuum ports 921 (three are shown as an example) from only one side of the wheel 120. FIG. 9c describes an arrangement of several vacuum ports 931 (four are shown as an example) between two consecutive wheels (preferably close as possible). FIG. 9d describes a compound arrangement of one or more vacuum ports 941 at the sides of the wheels 120 and one or more vacuum ports 942 between two consecutive wheels (preferably close as possible). FIG. 9c describes an arrangement of several vacuum ports 951 between two adjoin wheels (See also FIG. 7b and FIG. 8c).

Figure 10A:
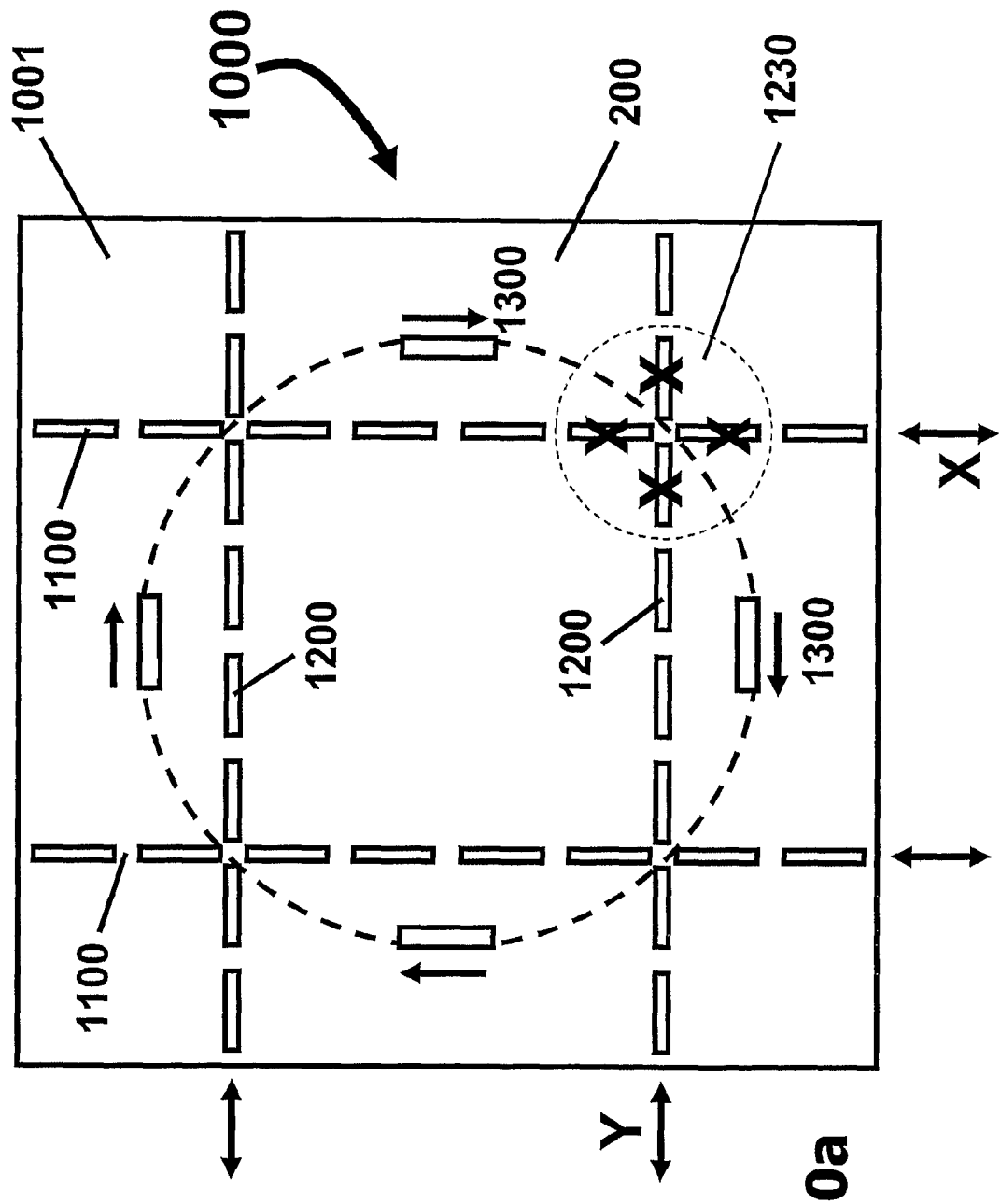
FIG. 10a illustrates a non-contact distribution module 1000 having two crossing VPL-conveyors (wheel after wheel configuration) and a VPL-rotation mechanism. Each of the VPL-rotating wheels is equipped with an individual drive. All wheel's drives are electronically synchronized.

FIG. 10a illustrates, with respect to some prefer embodiments of the present invention, an automotive module 1000 for handling, conveying, rotating and directing substrates, such as FPD glass, that is based on VPL drive concepts. Module 1000 includes a non-contact platform 1001 and 3 individual VPL drive units—two crossing linear VPL drive units 1100 and 1200 (wheel after wheel configuration), and one VPL rotating unit 1300 having four wheels 1301. Wheels 1301 of VPL-rotating unit 1300 may optionally synchronically operate by four separate motors. By using such a module, switching from one drive unit to another drive unit may be done only by switching the vacuum from "on" to "off". Such a module has also some positioning sensors (not shown) and accessory means such as aligners to control the various available substrate handling missions (not shown). Some examples of the use of such an AM-robotic module are:

The substrate is conveyed through module 1000 by active VPL-drive unit 1200 (active, meaning vacuum "on") in Y-direction The substrate is conveyed through module 1000 by active VPL drive unit 1100 (active, meaning vacuum "on") in X-direction.

The substrate is conveyed by VPL drive unit 1200 (Y-direction) to the center of 1000 and then drive wheels of 1200 stop. Then the substrate continues to move in X-direction (vacuum of VPL drive unit 1100 is set to "on", Vacuum of VPL drive unit 1200 is set to "off" and then drive wheels of 1100 are operated).

The substrate is (a) transferred by VPL drive unit 1200 (in Y-direction) to the center of 1000 (drive wheels stops), (b) vacuum to 1300 set to "on" and than vacuum to 1100 is set to "off" to provide handshaking without sleeping out, (c) wheels 1301 are operated to complete 90 deg rotation of the substrate, (d) vacuum to 1100 set to "on" and than vacuum to 1300 is set to "off", (e) Wheels drive of 1200 are operate to transfer the substrate in X-direction.

The substrate is conveyed in X-direction by VPL drive unit 1200 to the center of 1000 and stops, rotate and continue to move out in X-direction.

It has to be emphasized that in such crossing rows of drive wheels a failure link may occur if crossing wheels are too close as seen in the four drive wheels 1230, bounded in dashed line, as vacuum holding down force may bring the substrate to contact with the crossing wheels. Such problem may be easily solved just by eliminating at least two of the wheels of same row or eliminating all four wheels of group 1230.

Figure 10B:
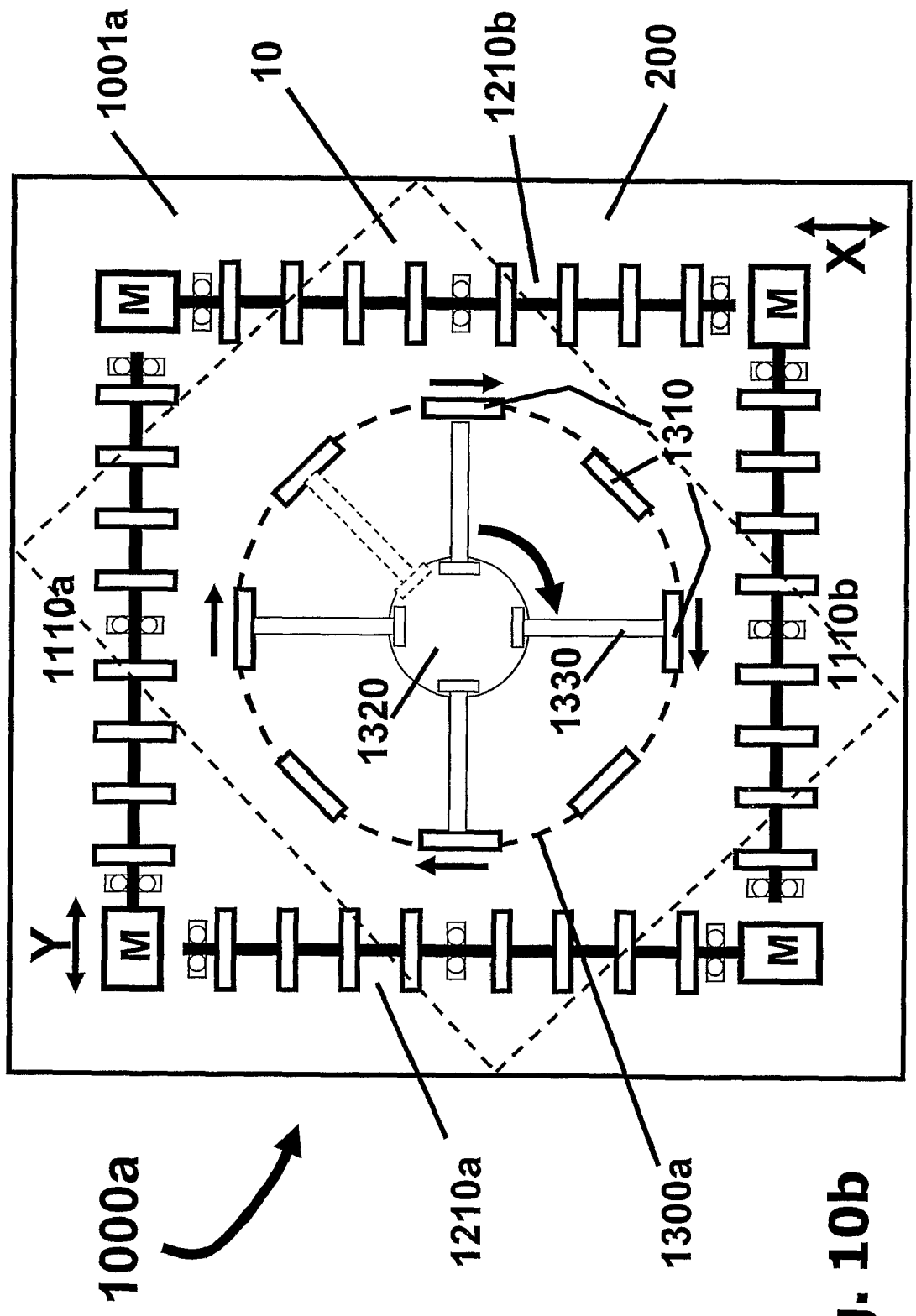
FIG. 10b illustrates a non-contact distribution module 1001 having two crossing VPL-conveyors (side-by-side configuration) and a VPL-rotation mechanism. All wheels of the VPL-rotating mechanism are driven by a common Bevel-gear transmission box.

FIG. 10*b* illustrates, with respect to prefer embodiments of the present invention, an alternative design automotive module 1000*a* (with respect to automotive module 1000 that is illustrates in FIG. 10*a*), used for handling, conveying, rotating and directing substrates, such as FPD glass, that is based on VPL drive concepts. Module 1000*a* includes a non-contact platform 1001*a* and 5 individual VPL drive units, two side-by-side configuration units (1110*a*,1110*b*) for providing linear motion in X-direction, two side-by-side configuration units (1210*a*,1210*b*) for providing linear motion in Y-direction and one VPL-rotation unit 1300*a*. The drive wheels 1310 of VPL-rotation unit 1300*a* are operated by common Bevel-gear transmission box 1320 via individual shafts 1330. This kind of design is very cost-effective, and provides same operative modes as described with respect to Module 1000 illustrated in FIG. 10*a*. Similarly, also the practice of controlling the various missions by switching vacuum from "on" to "off" and vise-versa is adopted.

Figure 11:
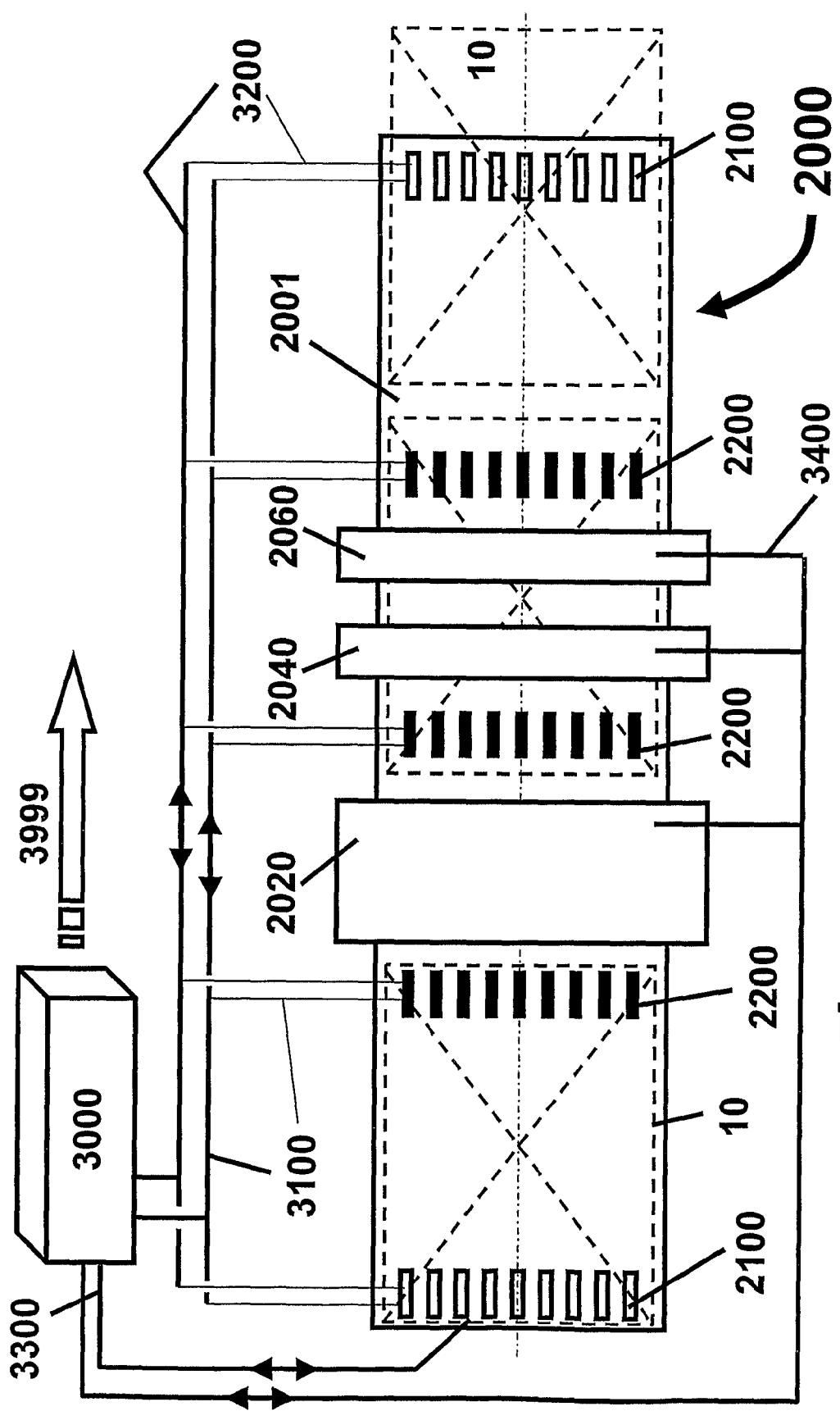
FIG. 11 illustrates a non-contact track hosting three consecutive processes with VPL-handling system that includes both equipment for loading/unloading and equipment for accurate linear motion.

FIG. 11 illustrates, with respect to a prefer embodiment of the present invention, a system based on a non-contact track 2000 that hosts three consecutive processes (2020, 2040 and 2060), positioned above an elongated AM-platform 2001. Track 200 provided with VPL-handling system comprises of five side-by-side configuration VPL-units. It includes VPL drive units for both loading/unloading and for providing accurate linear motion. The VPL conveying units 2100 are provided for loading and unloading missions (where substrate 10 is transferred at a typical speed of up to 200 cm/sec and more). The accurate linear motion during the processes is provided by three accurate VPL conveying units 2200, providing accurate positioning and stable and precise velocity (Typically in the range of 5 cm/sec to 50 cm/sec). Processing is executed as the substrate is being linearly transferred in an accurate manner while it floats over the AM-platform. During processing, at least one of the process tools that are positioned above the glass may be very close to the top surface of substrate 10, thus very accurate AM-platform, i.e. an air-cushion (such as the vacuum-preload (PV) air-cushion (PV-type fluid-cushion is a vacuum preloaded fluid cushion generated by an active surface with a plurality of pressure ports, and evacuation outlets connected to a vacuum source, thus excessive fluid is evacuated by that vacuum, see WO 03/060961, incorporated herein by reference), that provides accurate and stable air-gap must be applied. In order to facilitate continuous transfer, the distance between each of the VPL-unit must be slightly shorter that the length of the substrate. System 2000 is further provided with control box 3000 that communicates (3999), with higher hierarchy central control. Control box 3000 is connected to each of the VPL-drive unit by lines 3100 that are associated with pressure/vacuum supply to the unit and lines that associated with motion system (including connection to sensing means such as proximity sensors or encoders). Control box 3000 also controls the constable parameters of the AM-platform 2001 (lines 3300), including all feedback sensors involved. In addition, control box 3000 is communicated (lines 3400) with the process tools 2020, 2040 and 2060.

It is very important to emphasize the advantages of using side-by-side accurate VPL-drive units (as shown for example in FIGS. 7*e*-7*h*, and FIG. 11) compared with a conventional linear drive system (as shown for example in FIG. 5*b*). By using side by-side VPL-drive unit for substrate handling over an accurate AM platform, the accurate process zone provides a homogenous non-contact support with no slots or crossing grooves, and there are no dynamic fluctuations that may be induced by the linear motion system.

Accordingly, an accurate (side-by side configuration) VPL-drive unit provides undisturbed processing zone both in local and dynamic manner with respect to a conventional linear drive system that is crossing the processing zone. Typical performances of the accurate VPL-drive unit are:

Positioning accuracy of about 10 micron for 1 m stroke

Velocity ripple of less that 1% at velocity higher than 20 cm/sec.

Acceleration up to 0.5 G (depends on number of wheels)

Velocity up to about 100 cm/sec

Figure 12:
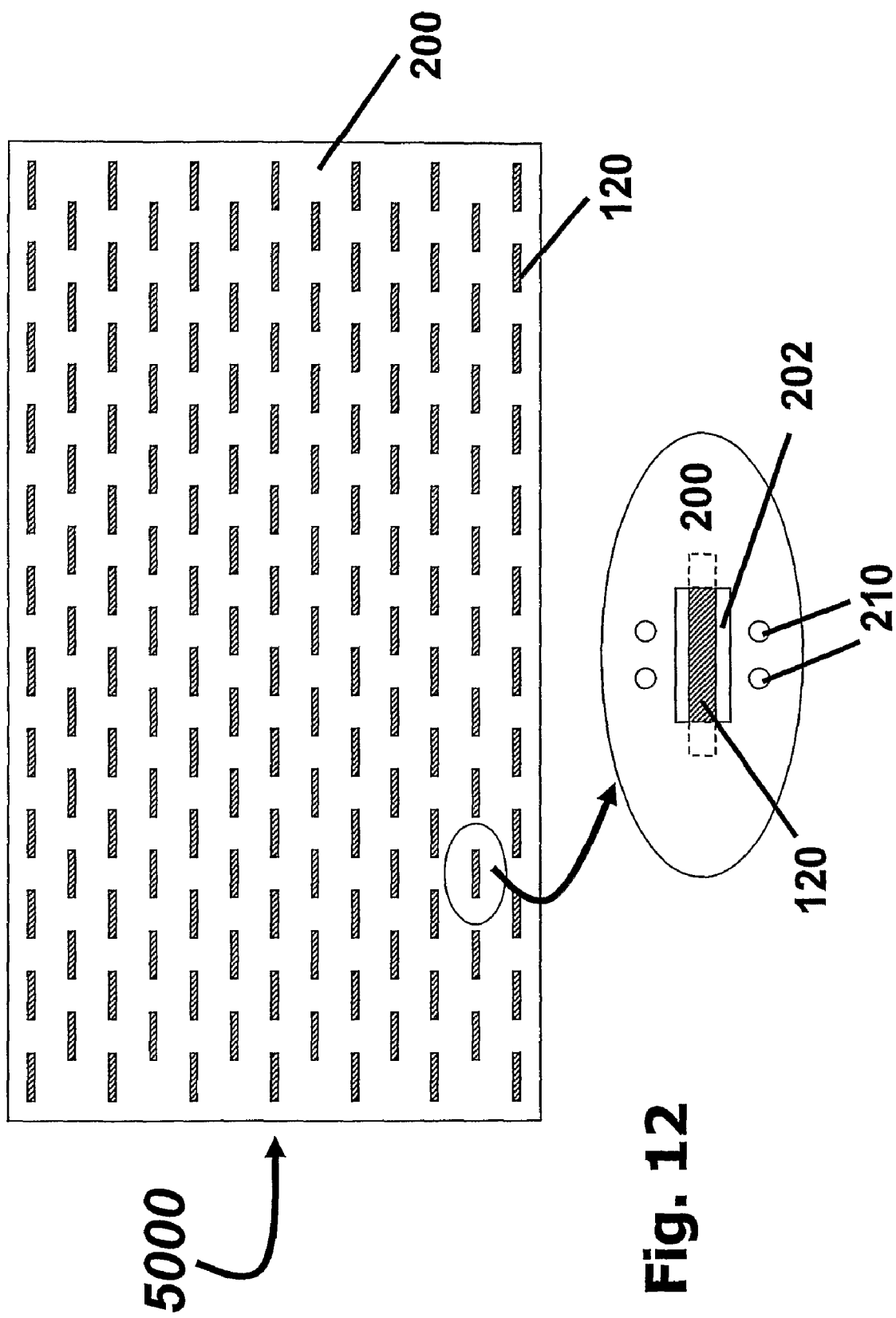
FIG. 12 illustrates a VPL-platform with drive-wheels that are distributed over the top surface of the platform.

FIG. 12 illustrates, with respect to a prefer embodiment of the present invention, a VPL-platform 5000 with drive-wheels 1200 that are distributed over the top surface of the platform that acts also as the counter plate 200 with respect to the VPL-concept. Without derogating generality, a staggered arrangement of drive-wheels is presented in the figure, but any other two-dimensional arrangement may alternatively be applied. Detailed view around one drive-wheel 120 shows the slot 202 created in 200 for the drive wheel 120 and the vacuum ports 210 beside the drive-wheel 120. This platform may be used for relatively thick substrates and it is aimed at providing a capability to flatten such substrates (for example thick Solar-cell glass). Note that this version has no pressure ports. Throughout the present specification the terms "AM-platform", "NC-platform", "Module", "conveying module" are exchangeable unless otherwise implied. Throughout the present specification the term "AM-platform" usually refers to NC-conveying equipment or to NC-platform of a process machine unless otherwise implied. By the term "motion" is meant linear, linear and accurate, rotational or similar motion.

Throughout the present specification the terms "Drive-wheels unit", "VPL drive unit", general purpose or accurate drive unit are exchangeable, unless otherwise implied. By "wheels" is meant in most cases drive-wheels or VPL-drive-wheels.

It should be clear that the description of the embodiments and attached Figures set forth in this specification serves only for a better understanding of the invention, without limiting its scope.

It should also be clear that a person skilled in the art, after reading the present specification could make adjustments or amendments to the attached Figures and above described embodiments that would still be covered by the present invention.

The invention claimed is:

1. A system for conveying and for accurately handling a generally flat object employing a plurality of support elements, the device comprising:
   a plurality of vacuum preload drive wheels arranged in one or more drive units, each drive unit comprising at least one vacuum preload drive wheel for applying a lateral drive force to the object;
   one or more counter plates adjacent to each of the vacuum preload drive wheels, each counter plate including one or more peripheral pressure ports connectable to a pressure source for exerting a repelling force on the object so as to prevent physical contact between the object and the system; and
   one or more vacuum ports located on said one or more counter plates for applying induced holding-down forces on the object, the vacuum ports of each drive unit being fluidically connected to a main vacuum pipe that is connectable via a controllable valve to a vacuum source;
   whereby when the main vacuum pipe is connected to the vacuum source the normal force between the object and the vacuum preload drive wheels is increased and accordingly the lateral drive force is increased.

2. The system as claimed in claim 1, further provided with pressurized air supply piping connected through a controllable valve to the main vacuum pipe.

3. The system as claimed in claim 1, wherein the vacuum ports communicate with the vacuum source via flow restrictors.

4. The system as claimed in claim 1, wherein the pressure ports communicate with the pressure source via flow restrictors.

5. The system as claimed in claim 1, wherein the support elements comprise one or more aeromechanical support surfaces.

6. The system as claimed in claim 1, wherein the support elements comprise additional drive wheels.

7. The system as claimed in claim 1, wherein each drive unit comprises vacuum preload drive wheels arranged side by side having a common shaft.

8. The system as claimed in claim 7, wherein vacuum preload drive wheels of the common shaft and the common shaft are integral, created in machining from a single metal piece.

9. The system as claimed in claim 8, wherein each wheel of the common shaft is provided with a non-metallic ring for enhancing friction having a width of a few millimeters.

10. The system as claimed in claim 7, wherein each drive unit is separately driven by a motor.

11. The system as claimed in claim 10, wherein the motor of each drive unit is directly connected to the common shaft of that drive unit.

12. The system as claimed in claim 7, wherein two or more adjacent drive units are driven by a common motor.

13. The system as claimed in claim 7, wherein two or more adjacent drive units are driven by separate motors and are electronically synchronized.

14. The system as claimed in claim 7, wherein two or more drive units are aligned in substantially parallel along a common axis, and operable separately to obtain differential drive.

15. The system as claimed in claim 7, wherein at least some of the drive units are further provided with an encoder for motion control.

16. The system as claimed in claim 1, wherein at least some of said one or more drive units are adapted to facilitate drive in opposite directions.

17. The system as claimed in claim 1, wherein, each drive unit comprises vacuum preload drive wheels arranged one after the other.

18. The system as claimed in claim 1, wherein the drive units are arranged to facilitate conveying in more than one direction.

19. The system as claimed in claim 18, wherein the drive units are arranged to facilitate conveying in substantially perpendicular directions.

20. The system as claimed in claim 18, wherein at least one rotation drive unit comprises drive vacuum preload wheels distributed around a circle and driven in same direction tangential to the circle, facilitating rotation of the object.

21. The system as claimed in claim 20, wherein said at least one rotation drive unit is driven by a Bever-Gear transmission box.

22. The system as claimed in claim 1, wherein a lift mechanism is provided to one or more of said one or more drive units for lifting and lowering the drive unit.

23. The system as claimed in claim 1, wherein a lift mechanism is provided to one or more of said one or more drive units for lifting and lowering the drive wheels.

24. The system as claimed in claim 1, wherein one or more of said at least one drive units comprises one or two counter plates adjacent each drive wheel of the drive unit.

25. The system as claimed in claim 1, wherein one or more of said at least one drive units comprises one counter plate with slots wherein the drive wheels are embedded in the slots.

26. The system as claimed in claim 25, further provided with a plurality of pressure ports for facilitating creation of local air-cushion when connected to a pressure source.

27. The system as claimed in claim 1, wherein the plurality of support elements comprises an aeromechanical support platform and wherein the counter plates of one or more drive units are incorporated in the aeromechanical support platform.

28. The system as claimed in claim 27, wherein said one or more counter plates of one or more drive units are integral part of the aeromechanical support platform.

29. The system as claimed in claim 27, wherein the vacuum preload drive wheels protrude above a top surface of the counter plates at a height that is about half of a floating gap of the object when positioned over the wheels and when the vacuum ports are disconnected from the vacuum source.

30. The system as claimed in claim 1, further provided with a control unit for controlling operation of each drive unit.

31. The system as claimed in claim 1, further provided with a proximity sensor.

32. The system as claimed in claim 1, wherein said one or more drive units are separable from the system.

33. The system as claimed in claim 1, wherein the drive wheels protrude in the range between 50 to 500 micrometers over a top surface of said one or more counter plate.

34. The system as claimed in claim 1, wherein at least some of said one or more vacuum ports adjacent a drive wheel are each distanced in a range between 10 to 30 millimeter from a point on the drive wheel which comes in contact with the object.

35. The system as claimed in claim 1, wherein vacuum preload drive wheels located at side edges of the system are each provided with a flange to prevent the object from straying outwardly.

36. The system as claimed in claim 1, wherein the vacuum preload drive wheels of a drive unit comprise each a double wheel.

37. The system as claimed in claim 1, wherein the drive wheels of a drive unit are densely distributed in a two dimensional arrangement across a single counter plate, facilitating conveying of the object while flattening it to a desired flatness.

* * * * *